US008558601B2

(12) United States Patent
Jang et al.

(10) Patent No.: US 8,558,601 B2
(45) Date of Patent: Oct. 15, 2013

(54) GATE DRIVING CIRCUIT

(75) Inventors: Yong-Ho Jang, Gyeonggi-do (KR); Seung-Chan Choi, Gyeonggi-do (KR); Jae-Yong You, Seoul (KR); Woo-Seok Choi, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/541,904

(22) Filed: Jul. 5, 2012

(65) Prior Publication Data

US 2013/0010916 A1 Jan. 10, 2013

(30) Foreign Application Priority Data

Jul. 5, 2011 (KR) ........................ 10-2011-0066477

(51) Int. Cl.
*G04F 1/04* (2006.01)
*H03K 3/00* (2006.01)

(52) U.S. Cl.
USPC ............. 327/295; 327/298; 327/299; 377/64; 377/79

(58) Field of Classification Search
USPC ....................... 327/295, 298, 299; 377/64, 79
See application file for complete search history.

(56) References Cited

U.S. PATENT DOCUMENTS

2011/0274236 A1* 11/2011 Tobita ............................ 377/79

* cited by examiner

*Primary Examiner* — John Poos
(74) *Attorney, Agent, or Firm* — Morgan, Lewis & Bockius LLP

(57) ABSTRACT

Disclosed herein is a gate driving circuit including a first clock generator to sequentially output n output clock pulses, a second clock generator to sequentially output n output control clock pulses, and a shift register to receive the n output clock pulses and the n output control clock pulses and to sequentially output a plurality of scan pulses, wherein high sections of k-th to (k+s)-th output clock pulses output during adjacent periods overlap with one another, a k-th output control clock pulse rises before the k-th output clock pulse, the k-th output control clock pulse falls before a (k−a)-th output clock pulse, a high section of the output control clock pulses does not overlap with that of the k-th output clock pulse, and a (k+b)-th output clock pulse falls during the high section of the output control clock pulses not overlapping with that of the k-th output clock pulse.

20 Claims, 19 Drawing Sheets

GATE DRIVING CIRCUIT

This application claims the benefit of Korean Patent Application No. 10-2011-0066477, filed on Jul. 5, 2011 which is hereby incorporated by reference as if fully set forth herein.

BACKGROUND OF THE INVENTION

1. Field of the Invention

The present invention relates to a gate driving circuit, and more particularly, to a gate driving circuit in which leakage of charge from a set node is prevented to stabilize an output from a stage.

2. Discussion of the Related Art

A shift register outputs a plurality of scan pulses in order to sequentially drive gate lines of a display device, such as a liquid crystal display. To this end, the shift register includes a plurality of switching devices. An oxide semiconductor transistor may be employed as such a switching device.

FIG. 1 is a view illustrating relational characteristics between a gate voltage and drain current of a conventional oxide semiconductor transistor based on temperature.

For an N-type oxide semiconductor transistor used in a shift register, a threshold voltage thereof preferably has a positive value. However, as temperature increases, the threshold voltage of the oxide semiconductor transistor moves negatively, as shown in FIG. 1. For this reason, the N-type oxide semiconductor transistor, which has to be turned off in an output period of the shift register, may not be normally turned off at a high temperature, thereby generating leakage current. This leakage current may lower a voltage at a set node, resulting in a problem that the output of the shift register is not normally generated.

FIG. 2 is a view illustrating a voltage at a set node and a voltage of a scan pulse based on variation in a threshold voltage of a conventional oxide semiconductor transistor.

As can be seen from FIG. 2(*a*), when the threshold voltage of the oxide semiconductor transistor is −1, the voltage at the set node rapidly falls due to leakage current of the oxide semiconductor transistor, such that the voltage of the scan pulse, which is an output of a shift register, rapidly falls too.

Also, as can be seen from FIG. 2(*b*), when the threshold voltage of the oxide semiconductor transistor is −3, the leakage current of the oxide semiconductor transistor further increases, such that the voltage at the set node cannot rise, thereby causing the scan pulse not to be generated at all.

SUMMARY OF THE INVENTION

Accordingly, the present invention is directed to a gate driving circuit that substantially obviates one or more problems due to limitations and disadvantages of the related art.

An object of the present invention is to provide a gate driving circuit in which a clock pulse supplied to a pull-up switching device which is in charge of output and clock pulses supplied to switching devices which are in charge of charging/discharging a set node have different waveforms, thereby preventing current leakage from the set node.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a gate driving circuit includes a first clock generator to sequentially output n (n being a natural number equal to or greater than 2) output clock pulses having different phases in a circulating manner, a second clock generator to sequentially output n output control clock pulses having different phases in a circulating manner, and a shift register to receive the n output clock pulses from the first clock generator and the n output control clock pulses from the second clock generator and to sequentially output a plurality of scan pulses, wherein high sections of k-th to (k+s)-th (s being a natural number greater than 1) output clock pulses output during adjacent periods overlap with one another for a predetermined time, a k-th output control clock pulse rises before the k-th output clock pulse, the k-th output control clock pulse falls before a (k−a)-th (a being a natural number less than k) output clock pulse, a high section of at least one of the output control clock pulses does not overlap with that of the k-th output clock pulse, and a (k+b)-th (b being a natural number) output clock pulse falls during the high section of the at least one of the output control clock pulses not overlapping with that of the k-th output clock pulse.

Voltage of each of the output clock pulses in a low section thereof may be greater than or equal to that of each of the output control clock pulses in a low section thereof.

The shift register may include a plurality of stages to sequentially output scan pulses, each of the stages may output a scan pulse through an output terminal thereof, the n output control clock pulses may be transferred through n output control clock lines, the n output clock pulses may be transferred through n output clock lines, a p-th (p being a natural number) stage includes a first switching device turned on or off according to one of the n output control clock pulses and interconnecting an output terminal of a (p−q)-th (q being a natural number less than p) stage or a first start transfer line transferring a first start pulse and a set node when turned on, a second switching device turned on or off according to one of the n output control clock pulses and interconnecting the set node and an output terminal of a (p+r)-th (r being a natural number) stage or a second start transfer line transferring a second start pulse when turned on, and a pull-up switching device turned on or off according to voltage applied to the set node and interconnecting one of the output clock lines and an output terminal of the p-th stage when turned on, a k-th output clock pulse may be supplied to the pull-up switching device, a k-th output control clock pulse may be supplied to the first switching device, a high section of an output control clock pulse supplied to the second switching device may not overlap with that of the k-th output clock pulse, and a (k+b)-th output clock pulse may fall during the high section of the output control clock pulse supplied to the second switching device.

The shift register may include a plurality of stages to sequentially output scan pulses, each of the stages may output a scan pulse through an output terminal thereof, the n output control clock pulses may be transferred through n output control clock lines, the n output clock pulses may be transferred through n output clock lines, a p-th (p being a natural number) stage may include a first switching device turned on or off according to one of the n output control clock pulses and interconnecting an output terminal of a (p−q)-th (q being a natural number less than p) stage or a first start transfer line transferring a first start pulse and a set node when turned on, a second switching device turned on or off according to one of the n output control clock pulses and interconnecting the set node and an output terminal of a (p+r)-th (r being a natural number) stage when turned on, a third switching device turned on or off according to an output clock pulse from one of the output clock lines and interconnecting a charging voltage line transferring a charging voltage and a reset node when turned on, a fourth switching device turned on or off according to voltage applied to the set node and interconnecting the reset node and a second discharging voltage line transferring a second discharging voltage when turned on, a pull-up switching device turned on or off according to voltage applied to the set node and interconnecting one of the output clock lines and an output terminal of the p-th stage when turned on, and a pull-down switching device turned on or off according to voltage applied to the reset node and interconnecting the output terminal of the p-th stage and a first discharging voltage line transferring a first discharging voltage when turned on, a k-th output clock pulse may be supplied to the pull-up switching device, a k-th output control clock pulse may be supplied to the first switching device, a high section of an output control clock pulse supplied to the second switching device may not overlap with that of the k-th output clock pulse, and a (k+b)-th output clock pulse may fall during the high section of the output control clock pulse supplied to the second switching device.

The shift register may include a plurality of stages to sequentially output scan pulses, each of the stages may output a scan pulse through an output terminal thereof, the n output control clock pulses may be transferred through n output control clock lines, the n output clock pulses may be transferred through n output clock lines, a p-th (p being a natural number) stage may include a first switching device turned on or off according to one of the n output control clock pulses and interconnecting an output terminal of a (p−q)-th (q being a natural number less than p) stage or a first start transfer line transferring a first start pulse and a set node when turned on, a second switching device turned on or off according to one of the n output control clock pulses and interconnecting the set node and an output terminal of a (p+r)-th (r being a natural number) stage when turned on, a third switching device turned on or off according to an output clock pulse from one of the output clock lines and interconnecting a charging voltage line transferring a charging voltage and a common node when turned on, a fourth switching device turned on or off according to voltage applied to the set node and interconnecting the common node and a second discharging voltage line transferring a second discharging voltage when turned on, a fifth switching device turned on or off according to voltage applied to the common node and interconnecting the charging voltage line and a reset node when turned on, a sixth switching device turned on or off according to voltage applied to the set node and interconnecting the reset node and the second discharging voltage line when turned on, a pull-up switching device turned on or off according to voltage applied to the set node and interconnecting one of the output clock lines and an output terminal of the p-th stage when turned on, and a pull-down switching device turned on or off according to voltage applied to the reset node and interconnecting the output terminal of the p-th stage and a first discharging voltage line transferring a first discharging voltage when turned on, a k-th output clock pulse may be supplied to the pull-up switching device, a k-th output control clock pulse may be supplied to the first switching device, a high section of an output control clock pulse supplied to the second switching device may not overlap with that of the k-th output clock pulse, and a (k+b)-th output clock pulse may fall during the high section of the output control clock pulse supplied to the second switching device.

The shift register may include a plurality of stages to sequentially output scan pulses, each of the stages may output a scan pulse through an output terminal thereof, the n output control clock pulses may be transferred through n output control clock lines, the n output clock pulses may be transferred through n output clock lines, a p-th (p being a natural number) stage may include a first switching device turned on or off according to one of the n output control clock pulses and interconnecting an output terminal of a (p−q)-th (q being a natural number less than p) stage or a first start transfer line transferring a first start pulse and a set node when turned on, a second switching device turned on or off according to one of the n output control clock pulses and interconnecting the set node and an output terminal of a (p+r)-th (r being a natural number) stage when turned on, a third switching device turned on or off according to an output control clock pulse from one of the output control clock lines or an output clock pulse from one of the output clock lines and interconnecting an output terminal of the p-th stage and a charging voltage line transferring a charging voltage when turned on, and a pull-up switching device turned on or off according to voltage applied to the set node and interconnecting one of the output clock lines and the output terminal of the p-th stage when turned on, a k-th output clock pulse may be supplied to the pull-up switching device, a k-th output control clock pulse may be supplied to the first switching device, a high section of an output control clock pulse supplied to the second switching device may not overlap with that of the k-th output clock pulse, a (k+b)-th output clock pulse may fall during the high section of the output control clock pulse supplied to the second switching device, and a high section of an output control clock pulse supplied to the third switching device may not overlap with that of the k-th output clock pulse.

The shift register may include a plurality of stages to sequentially output scan pulses, each of the stages may output a scan pulse through an output terminal thereof, the n output control clock pulses may be transferred through n output control clock lines, the n output clock pulses may be transferred through n output clock lines, a p-th (p being a natural number) stage may include a first switching device turned on or off according to one of the n output control clock pulses and interconnecting an output terminal of a (p−q)-th (q being a natural number less than p) stage or a first start transfer line transferring a first start pulse and a set node when turned on, a second switching device turned on or off according to one of the n output control clock pulses and interconnecting the set node and an output terminal of a (p+r)-th (r being a natural number) stage when turned on, a third switching device turned on or off according to an output control clock pulse from one of the output control clock lines or an output clock pulse from one of the output clock lines and interconnecting an output terminal of the p-th stage and one of the output clock lines when turned on, and a pull-up switching device turned on or off according to voltage applied to the set node and interconnecting one of the output clock lines and the output terminal of the p-th stage when turned on, a k-th output clock pulse may be supplied to the pull-up switching device, a k-th output control clock pulse may be supplied to the first switching device, a high section of an output control clock pulse supplied to the second switching device may not overlap with that of the k-th output clock pulse, a (k+b)-th output clock pulse may fall during the high section of the output control clock pulse supplied to the second switching device, a high section of an output control clock pulse supplied to the third switching device may not overlap with that of the k-th output clock pulse, and the output clock pulse supplied to the pull-up switching device and the output clock pulse supplied to the third switching device may be the same.

The p-th stage may further include a fourth switching device turned on or off according to voltage from the output terminal of the p-th stage and interconnecting the output terminal of the p-th stage and one of the output clock lines when turned on, and the output clock pulse supplied to the pull-up switching device and the output clock pulse supplied to the fourth switching device may be the same.

The shift register may include a plurality of stages to sequentially output scan pulses, each of the stages may output a scan pulse through an output terminal thereof, the n output control clock pulses may be transferred through n output control clock lines, the n output clock pulses may be transferred through n output clock lines, a p-th (p being a natural number) stage may include a first switching device turned on or off according to one of the n output control clock pulses and interconnecting an output terminal of a (p−q)-th (q being a natural number less than p) stage or a first start transfer line transferring a first start pulse and a set node when turned on, a second switching device turned on or off according to one of the n output control clock pulses and interconnecting the set node and an output terminal of a (p+r)-th (r being a natural number) stage when turned on, a third switching device turned on or off according to an output clock pulse from one of the output clock lines and interconnecting a charging voltage line transferring a charging voltage and a common node when turned on, a fourth switching device turned on or off according to voltage applied to the set node and interconnecting the common node and a second discharging voltage line transferring a second discharging voltage when turned on, a fifth switching device turned on or off according to voltage applied to the common node and interconnecting the charging voltage line and a reset node when turned on, a sixth switching device turned on or off according to voltage applied to the set node and interconnecting the reset node and the second discharging voltage line when turned on, a pull-up switching device turned on or off according to voltage applied to the set node and interconnecting one of the output clock lines and an output terminal of the p-th stage when turned on, and a pull-down switching device turned on or off according to voltage applied to the reset node and interconnecting the output terminal of the p-th stage and a first discharging voltage line transferring a first discharging voltage when turned on, a k-th output clock pulse may be supplied to the pull-up switching device, a k-th output control clock pulse may be supplied to the first switching device, a high section of an output control clock pulse supplied to the second switching device may not overlap with that of the k-th output clock pulse, a (k+b)-th output clock pulse may fall during the high section of the output control clock pulse supplied to the second switching device, and the high section of the output control clock pulse supplied to the second switching device may be included in that of an output clock pulse used as an output of a (p+r)-th stage.

The p-th stage may further include a seventh switching device turned on or off according to one of the n output control clock pulses and interconnecting the set node and a third discharging voltage line transferring a third discharging voltage when turned on, and a high section of an output control clock pulse supplied to the seventh switching device may not overlap with that of the k-th output clock pulse.

The n output clock pulses may include first to fourth output clock pulses having different phases or first to eighth output clock pulses having different phases, and the n output control clock pulses may include first to fourth output control clock pulses having different phases or first to eighth output control clock pulses having different phases.

The first clock generator may sequentially output the first to fourth output clock pulses in a circulating manner, and the second clock generator may sequentially output the first to fourth output control clock pulses in a circulating manner. The first output control clock pulse may rise before the first output clock pulse, the first output control clock pulse may fall before the fourth output clock pulse, a high section of the fourth output control clock pulse may not overlap with that of the first output clock pulse, and the second output clock pulse may fall during the high section of the fourth output control clock pulse. The second output control clock pulse may rise before the second output clock pulse, the second output control clock pulse may fall before the first output clock pulse, a high section of the first output control clock pulse may not overlap with that of the second output clock pulse, and the third output clock pulse may fall during the high section of the first output control clock pulse. The third output control clock pulse may rise before the third output clock pulse, the third output control clock pulse may fall before the second output clock pulse, a high section of the second output control clock pulse may not overlap with that of the third output clock pulse, and the fourth output clock pulse may fall during the high section of the second output control clock pulse. The fourth output control clock pulse may rise before the fourth output clock pulse, the fourth output control clock pulse may fall before the third output clock pulse, a high section of the third output control clock pulse may not overlap with that of the fourth output clock pulse, and the first output clock pulse may fall during the high section of the third output control clock pulse.

The first clock generator may sequentially output the first to eighth output clock pulses in a circulating manner, high sections of three adjacent ones of the output clock pulses may overlap with one another for a predetermined time, the second clock generator may sequentially output the first to eighth output control clock pulses in a circulating manner, and high sections of two adjacent ones of the output control clock pulses may overlap with each other for a predetermined time. The first output control clock pulse may rise before the first output clock pulse, the first output control clock pulse may fall before the seventh output clock pulse, high sections of the sixth, seventh and eighth output control clock pulses may not overlap with that of the first output clock pulse, and the third output clock pulse may fall during the high section of the sixth output control clock pulse. The second output control clock pulse may rise before the second output clock pulse, the second output control clock pulse may fall before the eighth output clock pulse, high sections of the seventh, eighth and first output control clock pulses may not overlap with that of the second output clock pulse, and the fourth output clock pulse may fall during the high section of the seventh output control clock pulse. The third output control clock pulse may rise before the third output clock pulse, the third output control clock pulse may fall before the first output clock pulse, high sections of the eighth, first and second output control clock pulses may not overlap with that of the third output clock pulse, and the fifth output clock pulse may fall during the high section of the eighth output control clock pulse. The fourth output control clock pulse may rise before the fourth output clock pulse, the fourth output control clock pulse may fall before the second output clock pulse, high sections of the first, second and third output control clock pulses may not overlap with that of the fourth output clock pulse, and the sixth output clock pulse may fall during the high section of the first output control clock pulse. The fifth output control clock pulse may rise before the fifth output clock pulse, the fifth output control clock pulse may fall before the third output clock pulse, high sections of the second, third and fourth output control clock pulses may not overlap with that of the fifth output clock pulse, and the seventh output clock pulse may fall during the high section of the second output control clock pulse. The sixth output control clock pulse may rise before the sixth output clock pulse, the sixth output control clock pulse may fall before the fourth output clock pulse, high sections of the third, fourth and fifth output control clock pulses may not overlap with that of the sixth output clock pulse, and the eighth output clock pulse may fall during the high section of the third output control clock pulse. The seventh output control clock pulse may rise before the seventh output clock pulse, the seventh output control clock pulse may fall before the fifth output clock pulse, high sections of the fourth, fifth and sixth output control clock pulses may not overlap with that of the seventh output clock pulse, and the first output clock pulse may fall during the high section of the fourth output control clock pulse. The eighth output control clock pulse may rise before the eighth output clock pulse, the eighth output control clock pulse may fall before the sixth output clock pulse, high sections of the fifth, sixth and seventh output control clock pulses may not overlap with that of the eighth output clock pulse, and the second output clock pulse may fall during the high section of the fifth output control clock pulse.

The n output clock pulses may include n forward output clock pulses, which are forwardly output, and n reverse output clock pulses, which are reversely output, and the n output control clock pulses may include n forward output control clock pulses, which are forwardly output, and n reverse output control clock pulses, which are reversely output.

The shift register may include a plurality of stages to sequentially output scan pulses, each of the stages may output a scan pulse through an output terminal thereof, the n output control clock pulses may be transferred through n first output control clock lines and n second output control clock lines, the n output clock pulses may be transferred through n output clock lines, odd ones of the stages may be respectively connected to odd-numbered gate lines via output terminals thereof, even ones of the stages may be respectively connected to even-numbered gate lines via output terminals thereof, the odd-numbered stages may be supplied with some of the n output clock pulses and with n output control clock pulses from the first output control clock lines, and the even-numbered stages may be supplied with the remainder of the n output clock pulses and with n output control clock pulses from the second output control clock lines.

The shift register may include a plurality of stages to sequentially output scan pulses, each of the stages may output a scan pulse through an output terminal thereof, the n output control clock pulses may be transferred through n output control clock lines, the n output clock pulses may be transferred through n output clock lines, odd ones of the stages may be respectively connected to odd-numbered gate lines via output terminals thereof, even ones of the stages may be respectively connected to even-numbered gate lines via output terminals thereof, the odd-numbered stages may be supplied with some of the n output clock pulses and with some of the n output control clock pulses, and the even-numbered stages may be supplied with the remainder of the n output clock pulses and with the remainder of the n output control clock pulses.

The shift register may include a plurality of stages to sequentially output scan pulses, each of the stages may output a scan pulse through an output terminal thereof, the n output control clock pulses may be transferred through n output control clock lines, the n output clock pulses may be transferred through n output clock lines, a p-th (p being a natural number) stage may include a first switching device turned on or off according to one of the n output control clock pulses and interconnecting an output terminal of a (p−q)-th (q being a natural number less than p) stage or a first start transfer line transferring a first start pulse and a set node when turned on, a second switching device turned on or off according to one of the n output control clock pulses and interconnecting the set node and an output terminal of a (p+r)-th (r being a natural number) stage when turned on, a third switching device turned on or off according to voltage applied to the set node and interconnecting a reset node and a second discharging voltage line transferring a second discharging voltage when turned on, a pull-up switching device turned on or off according to voltage applied to the set node and interconnecting one of the output clock lines and an output terminal of the p-th stage when turned on, a pull-down switching device turned on or off according to voltage applied to the reset node and interconnecting the output terminal of the p-th stage and a first discharging voltage line transferring a first discharging voltage when turned on, and a capacitor connected between one of the output clock lines and the reset node, a k-th output clock pulse may be supplied to the pull-up switching device, a k-th output control clock pulse may be supplied to the first switching device, a high section of an output control clock pulse supplied to the second switching device may not overlap with that of the k-th output clock pulse, a (k+b)-th output clock pulse may fall during the high section of the output control clock pulse supplied to the second switching device, and the output clock pulse supplied to the capacitor and the output clock pulse supplied to the pull-up switching device may be the same.

a and q may be the same, and b and r may be the same.

a, q, b and r may be the same.

s, a, b, q and r may be the same.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 3:
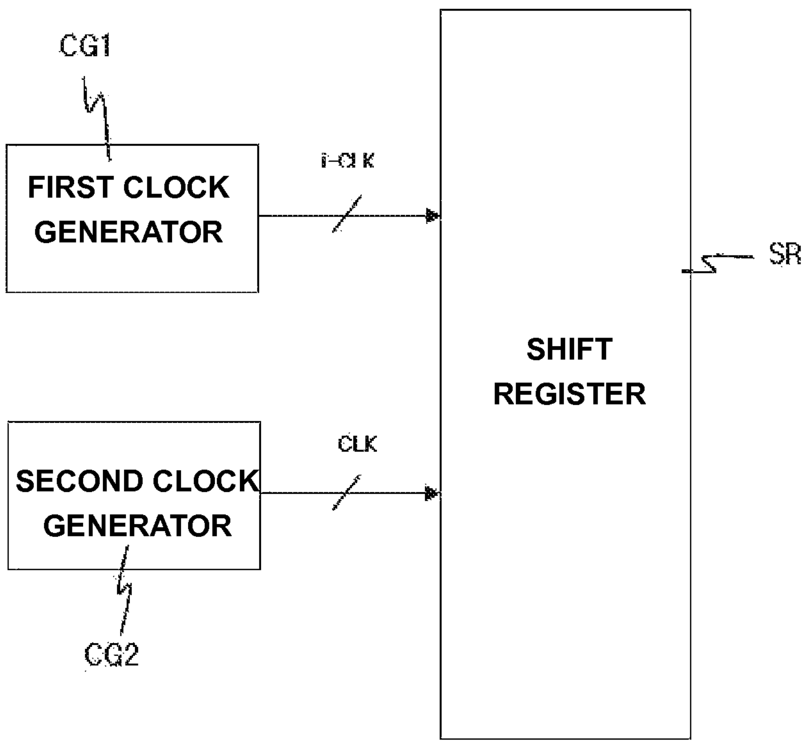
FIG. 3 is a block diagram showing a gate driving circuit according to an embodiment of the present invention.

FIG. 3 is a block diagram showing a gate driving circuit according to an embodiment of the present invention.

As shown in FIG. 3, the gate driving circuit includes a first clock generator CG1, a second clock generator CG2, and a shift register SR.

The first clock generator CG1 sequentially outputs n (n being a natural number equal to or greater than 2) output clock pulses CLK having different phases in a circulating manner. That is, the first clock generator CG1 sequentially outputs first to n-th output clock pulses, and then sequentially outputs the first to n-th output clock pulses. As a result, the first to n-th output clock pulses are sequentially output in a circulating manner. High sections of the n output clock pulses may have the same time length or different time lengths. Also, high sections of output clock pulses output during adjacent periods overlap with one another for a predetermined time. The n output clock pulses are transferred through n output clock lines.

The second clock generator CG2 sequentially outputs n (n being a natural number equal to or greater than 2) output control clock pulses i-CLK having different phases in a circulating manner. That is, the second clock generator CG2 sequentially outputs first to n-th output control clock pulses, and then sequentially outputs the first to n-th output control clock pulses. As a result, the first to n-th output control clock pulses are sequentially output in a circulating manner. High sections of the n output control clock pulses may have the same time length or different time lengths. Also, high sections of output control clock pulses output during adjacent periods may overlap with one another for a predetermined time or may not.

The shift register SR receives the n output clock pulses from the first clock generator CG1 and the n output control clock pulses from the second clock generator CG2 to sequentially output h (h being a natural number equal to or greater than 2) scan pulses.

The output clock pulses output from the first clock generator CG1 and the output control clock pulses output from the second clock generator CG2 have the following forms.

Figure 4:
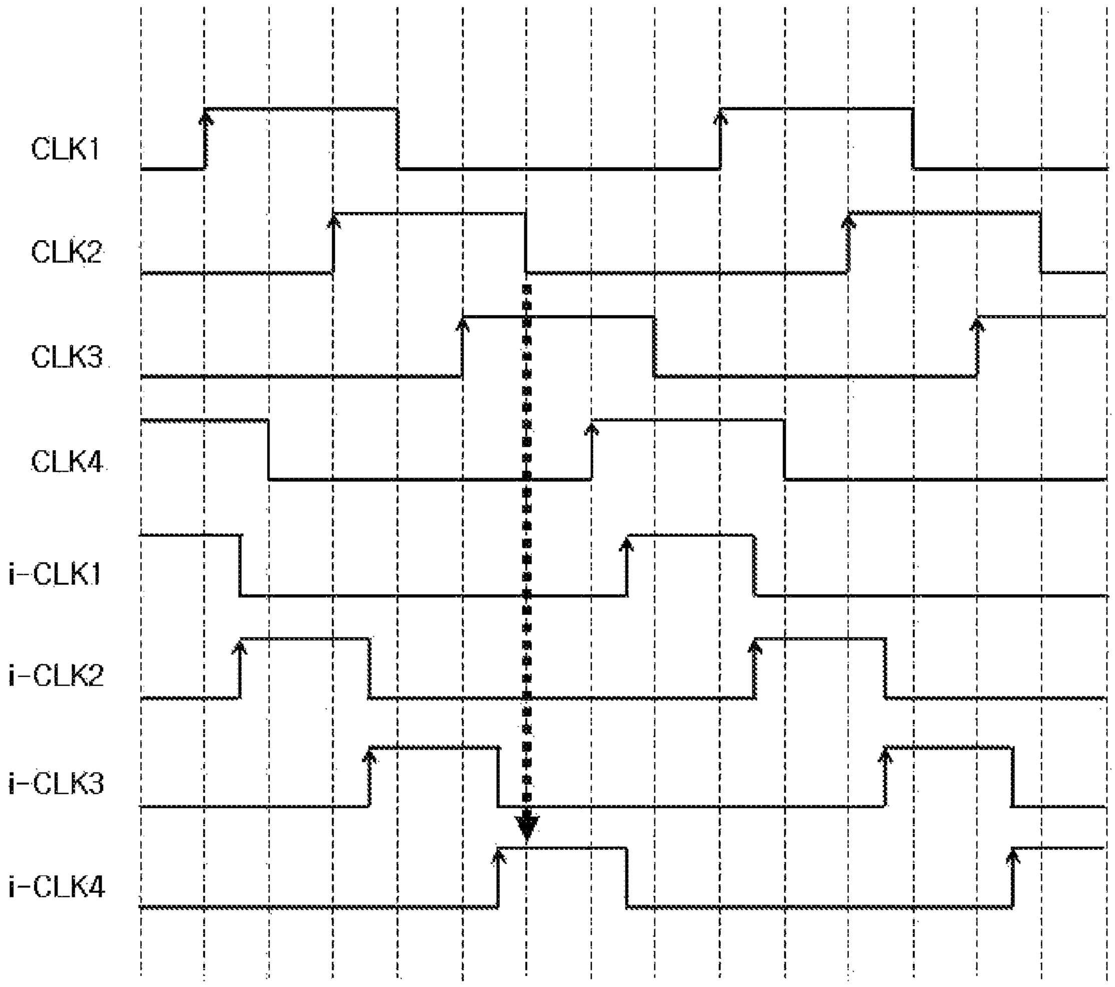
FIG. 4 is a timing diagram of output control clock pulses and output clock pulses according to a first embodiment of the present invention.

FIG. 4 is a timing diagram of output clock pulses and output control clock pulses according to a first embodiment of the present invention.

As shown in FIG. 4, the output clock pulses include four kinds of output clock pulses CLK1 to CLK4 having different phases, and the output control clock pulses include four kinds of output control clock pulses i-CLK1 to i-CLK4 having different phases. That is, FIG. 4 shows waveforms of the output clock pulses and the output control clock pulses when n=4.

As shown in FIG. 4, high sections of the first to fourth output clock pulses CLK1 to CLK4 overlap with one another by ⅓ s. That is, the first to fourth output clock pulses CLK1 to CLK4 each include a plurality of impulses which is periodically generated. High sections of corresponding impulses of the respective output clock pulses overlap with one another by ⅓ s. Specifically, as shown in FIG. 4, the high sections of the first to fourth output clock pulses each have a time length corresponding to three periods. Also, the impulses of the first to fourth output clock pulses are arranged at time intervals corresponding to five periods. Also, rising edges of adjacent output clock pulses are arranged at time intervals corresponding to two periods. The first to fourth output clock pulses having such characteristics are output in a circulating manner.

The first to fourth output control clock pulses i-CLK1 to i-CLK4 each include a plurality of impulses which is periodically or non-periodically generated. High sections of the first to fourth output control clock pulses i-CLK1 to i-CLK4 may overlap with one another or may not. In FIG. 4, the high sections of the first to fourth output control clock pulses i-CLK1 to i-CLK4 do not overlap with one another. Specifically, as shown in FIG. 4, the high sections of the first to fourth output control clock pulses each have a time length corresponding to two periods. Also, the impulses of the first to fourth output control clock pulses are arranged at time intervals corresponding to six periods. Also, rising edges of adjacent output control clock pulses are arranged at time intervals corresponding to two periods. The first to fourth output control clock pulses i-CLK1 to i-CLK4 having such characteristics are output in a circulating manner.

As shown in FIG. 4, a rising edge of a k-th output clock pulse is located in a high section of a k-th output control clock pulse. For example, a rising edge of the first output clock pulse CLK1 is located in a high section of the first output control clock pulse i-CLK1. A rising edge of the second output clock pulse CLK2 is located in a high section of the second output control clock pulse i-CLK2. A rising edge of the third output clock pulse CLK3 is located in a high section of the third output control clock pulse i-CLK3. A rising edge of the fourth output clock pulse CLK4 is located in a high section of the fourth output control clock pulse i-CLK4.

Also, the k-th output control clock pulse rises before the k-th output clock pulse. For example, the first output control clock pulse i-CLK1 rises before the first output clock pulse CLK1. The second output control clock pulse i-CLK2 rises before the second output clock pulse CLK2. The third output control clock pulse i-CLK3 rises before the third output clock pulse CLK3. The fourth output control clock pulse i-CLK4 rises before the fourth output clock pulse CLK4.

Also, the k-th output control clock pulse falls before a (k−a)-th (a being a natural number less than k; if the result value of k−a is equal to or less than 0, a remaining value obtained by dividing an absolute value of the result value by n replaces the result vale) output clock pulse. When a=1, the first output control clock pulse i-CLK1 falls before the fourth output clock pulse CLK4, the second output control clock pulse i-CLK2 falls before the first output clock pulse CLK1, the third output control clock pulse i-CLK3 falls before the second output clock pulse CLK2, and the fourth output control clock pulse i-CLK4 falls before the third output clock pulse CLK3.

Also, a high section of at least one output control clock pulse does not overlap with a high section of the k-th output clock pulse. For example, a high section of the first output clock pulse CLK1 overlaps with high sections of the first to third output control clock pulses i-CLK1 to i-CLK3 but does not overlap with a high section of the fourth output control clock pulse i-CLK4. Similarly, a high section of the second output clock pulse CLK2 overlaps with those of the second to fourth output control clock pulses i-CLK2 to i-CLK4 but does not overlap with that of the first output control clock pulse i-CLK1. Similarly, a high section of the third output clock pulse CLK3 overlaps with those of the third, fourth and first output control clock pulses i-CLK3, i-CLK4 and i-CLK1 but does not overlap with that of the second output control clock pulse i-CLK2. Similarly, a high section of the fourth output clock pulse CLK4 overlaps with those of the fourth, first and second output control clock pulses i-CLK4, i-CLK1 and i-CLK2 but does not overlap with that of the third output control clock pulse i-CLK3.

A (k+b)-th (b being a natural number; if the result vale of k+b is greater than n, a remaining value obtained by dividing the result value by n replaces the result value) output clock pulse falls during a high section of at least one output control clock pulse not overlapping with the high section of the k-th output clock pulse. When b=1, the second output clock pulse CLK2 falls during the high section of the fourth output control clock pulse i-CLK4 not overlapping with the first output clock pulse CLK1, the third output clock pulse CLK3 falls during the high section of the first output control clock pulse i-CLK1 not overlapping with the second output clock pulse CLK2, the fourth output clock pulse CLK4 falls during the high section of the second output control clock pulse i-CLK2 not overlapping with the third output clock pulse CLK3, and the first output clock pulse CLK1 falls during the high section of the third output control clock pulse i-CLK3 not overlapping with the fourth output clock pulse CLK4.

Upon defining an output control clock pulse rising before the k-th output clock pulse and falling before the (k−a)-th output clock pulse as a positive iso clock pulse, an output control clock pulse having a high section not overlapping with a high section of the k-th output clock pulse may be defined as a negative iso clock pulse corresponding to the positive iso clock pulse. When a=1, as shown in FIG. 4, the first output control clock pulse i-CLK1 is a positive iso clock pulse of the first output clock pulse CLK1, and the fourth output control clock pulse i-CLK4 is a negative iso clock pulse of the first output clock pulse CLK1. Similarly, the second output control clock pulse i-CLK2 is a positive iso clock pulse of the second output clock pulse CLK2, and the first output control clock pulse i-CLK1 is a negative iso clock pulse of the second output clock pulse CLK2. Similarly, the third output control clock pulse i-CLK3 is a positive iso clock pulse of the third output clock pulse CLK3, and the second output control clock pulse i-CLK2 is a negative iso clock pulse of the third output clock pulse CLK3. Similarly, the fourth output control clock pulse i-CLK4 is a positive iso clock pulse of the fourth output clock pulse CLK4, and the third output control clock pulse i-CLK3 is a negative iso clock pulse of the fourth output clock pulse CLK4.

Particularly, among the negative iso clock pulses, negative iso clock pulses satisfying a condition that "a (k+b)-th (for example, (k+1)-th) output clock pulse falls during a high section of at least one output control clock pulse not overlapping with the high section of the k-th output clock pulse" may be defined as full negative iso clock pulses. For example, since the first to fourth output control clock pulses i-CLK1 to i-CLK4 satisfy the above-mentioned condition, the fourth output control clock pulse i-CLK4 is a full negative iso clock pulse of the first output clock pulse CLK1, the first output control clock pulse i-CLK1 is a full negative iso clock pulse of the second output clock pulse CLK2, the second output control clock pulse i-CLK2 is a full negative iso clock pulse of the third output clock pulse CLK3, and the third output control clock pulse i-CLK3 is a full negative iso clock pulse of the fourth output clock pulse CLK4. That is, as shown in FIG. 4, the first to fourth output control clock pulses i-CLK1 to i-CLK4 satisfy the condition for negative iso clock pulses and full negative iso clock pulses.

Meanwhile, corresponding positive and negative iso clock pulses may overlap with each other or may not. For example, the first output control clock pulse i-CLK1 and the fourth output control clock pulse i-CLK4, which are respectively positive and negative iso clock pulses of the first output clock pulse CLK1, may overlap with each other or may not.

Figure 5:
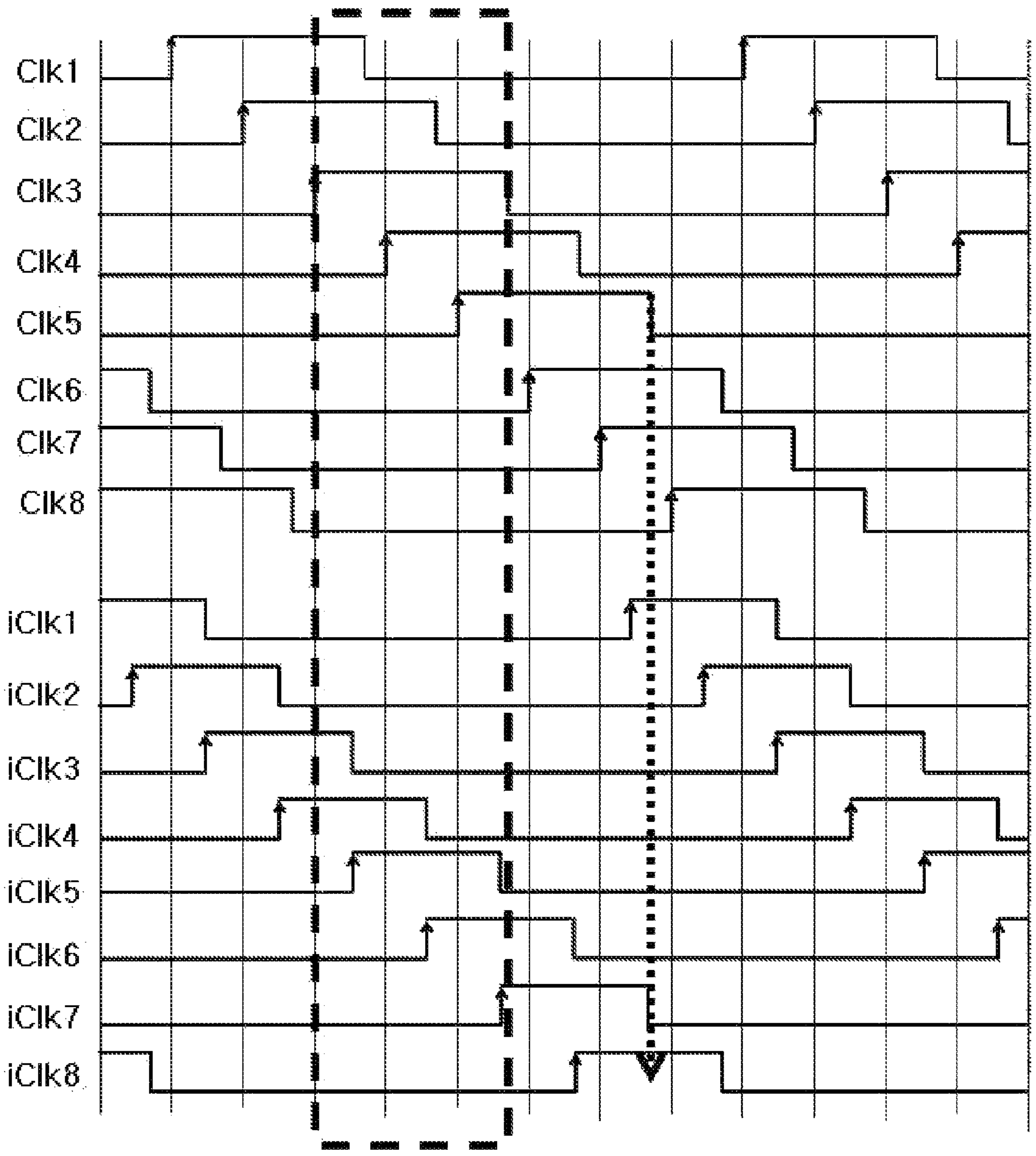
FIG. 5 is a timing diagram of output control clock pulses and output clock pulses according to a second embodiment of the present invention.

FIG. 5 is a timing diagram of output control clock pulses and output clock pulses according to a second embodiment of the present invention.

As shown in FIG. 5, the output clock pulses include eight kinds of output clock pulses CLK1 to CLK8 having different phases, and the output control clock pulses include eight kinds of output control clock pulses i-CLK1 to i-CLK8 having different phases. That is, FIG. 5 shows waveforms of the output clock pulses and the output control clock pulses when n=8.

As shown in FIG. 5, high sections of the first to eighth output clock pulses CLK1 to CLK8 overlap with one another by ⅗ s. That is, the first to eighth output clock pulses CLK1 to CLK8 each include a plurality of impulses which is periodically generated. High sections of corresponding impulses of the respective output clock pulses overlap with one another by ⅗ s. Specifically, as shown in FIG. 5, the high sections of the first to eighth output clock pulses CLK1 to CLK8 each have a time length corresponding to 2.7 periods. Also, the impulses of the first to eighth output clock pulses CLK1 to CLK8 are arranged at time intervals corresponding to 5.3 periods. Also, rising edges of adjacent output clock pulses are arranged at time intervals corresponding to one period. The first to eighth output clock pulses CLK1 to CLK8 having such characteristics are output in a circulating manner.

The first to eighth output control clock pulses i-CLK1 to i-CLK8 each include a plurality of impulses which is periodically or non-periodically generated. High sections of the first to eighth output control clock pulses i-CLK1 to i-CLK8 may overlap with one another or may not. In FIG. 5, the high sections of the first to eighth output control clock pulses i-CLK1 to i-CLK8 overlap with one another. Specifically, as shown in FIG. 5, the high sections of the first to eighth output control clock pulses i-CLK1 to i-CLK8 each have a time length corresponding to two periods. Also, the impulses of the first to eighth output control clock pulses i-CLK1 to i-CLK8 are arranged at time intervals corresponding to six periods. Also, rising edges of adjacent output control clock pulses are arranged at time intervals corresponding to two periods. The first to eighth output control clock pulses i-CLK1 to i-CLK8 having such characteristics are output in a circulating manner.

As shown in FIG. 5, a rising edge of a k-th output clock pulse is located in a high section of a k-th output control clock pulse. For example, a rising edge of the first output clock pulse CLK1 is located in a high section of the first output control clock pulse i-CLK1. A rising edge of the second output clock pulse CLK2 is located in a high section of the second output control clock pulse i-CLK2. A rising edge of the third output clock pulse CLK3 is located in a high section of the third output control clock pulse i-CLK3. A rising edge of the fourth output clock pulse CLK4 is located in a high section of the fourth output control clock pulse i-CLK4.

Also, the k-th output control clock pulse rises before the k-th output clock pulse. For example, the first output control clock pulse i-CLK1 rises before the first output clock pulse CLK1. The second output control clock pulse i-CLK2 rises before the second output clock pulse CLK2. The third output control clock pulse i-CLK3 rises before the third output clock pulse CLK3. The fourth output control clock pulse i-CLK4 rises before the fourth output clock pulse CLK4.

Also, the k-th output control clock pulse falls before a (k−a)-th (a being a natural number less than k) output clock pulse. When a=1, the first output control clock pulse i-CLK1 falls before the fourth output clock pulse CLK4, the second output control clock pulse i-CLK2 falls before the first output clock pulse CLK1, the third output control clock pulse i-CLK3 falls before the second output clock pulse CLK2, and the fourth output control clock pulse i-CLK4 falls before the third output clock pulse CLK3.

Also, a high section of at least one output control clock pulse does not overlap with a high section of the k-th output clock pulse. For example, a high section of the first output clock pulse CLK1 overlaps with high sections of the first to third output control clock pulses i-CLK1 to i-CLK3 but does not overlap with a high section of the fourth output control clock pulse i-CLK4. Similarly, a high section of the second output clock pulse CLK2 overlaps with those of the second to fourth output control clock pulses i-CLK2 to i-CLK4 but does not overlap with that of the first output control clock pulse i-CLK1. Similarly, a high section of the third output clock pulse CLK3 overlaps with those of the third, fourth and first output control clock pulses i-CLK3, i-CLK4 and i-CLK1 but does not overlap with that of the second output control clock pulse i-CLK2. Similarly, a high section of the fourth output clock pulse CLK4 overlaps with those of the fourth, first and second output control clock pulses i-CLK4, i-CLK1 and i-CLK2 but does not overlap with that of the third output control clock pulse i-CLK3.

A (k+b)-th output clock pulse falls during a high section of at least one output control clock pulse not overlapping with the high section of the k-th output clock pulse. When b=1, the second output clock pulse CLK2 falls during the high section of the fourth output control clock pulse i-CLK4 not overlapping with the first output clock pulse CLK1, the third output clock pulse CLK3 falls during the high section of the first output control clock pulse i-CLK1 not overlapping with the second output clock pulse CLK2, the fourth output clock pulse CLK4 falls during the high section of the second output control clock pulse i-CLK2 not overlapping with the third output clock pulse CLK3, and the first output clock pulse CLK1 falls during the high section of the third output control clock pulse i-CLK3 not overlapping with the fourth output clock pulse CLK4.

Upon defining an output control clock pulse rising before the k-th output clock pulse and falling before the (k-a)-th output clock pulse as a positive iso clock pulse, an output control clock pulse having a high section not overlapping with that of the k-th output clock pulse may be defined as a negative iso clock pulse corresponding to the positive iso clock pulse. When a=2, as shown in FIG. 5, the first output control clock pulse i-CLK1 is a positive iso clock pulse of the first output clock pulse CLK1, and the sixth to eighth output control clock pulse i-CLK6 to i-CLK8 are negative iso clock pulses of the first output clock pulse CLK1. Similarly, the second output control clock pulse i-CLK2 is a positive iso clock pulse of the second output clock pulse CLK2, and the seventh, eighth and first output control clock pulses i-CLK7, i-CLK8 and i-CLK1 are negative iso clock pulses of the second output clock pulse CLK2. Similarly, the third output control clock pulse i-CLK3 is a positive iso clock pulse of the third output clock pulse CLK3, and the eighth, first and second output control clock pulses i-CLK8, i-CLK1 and i-CLK2 are negative iso clock pulses of the third output clock pulse CLK3. Similarly, the fourth output control clock pulse i-CLK4 is a positive iso clock pulse of the fourth output clock pulse CLK4, and the first, second and third output control clock pulses i-CLK1, i-CLK2 and i-CLK3 are negative iso clock pulses of the fourth output clock pulse CLK4. Similarly, the fifth output control clock pulse i-CLK5 is a positive iso clock pulse of the fifth output clock pulse CLK5, and the second, third and fourth output control clock pulses i-CLK2, i-CLK3 and i-CLK4 are negative iso clock pulses of the fifth output clock pulse CLK5. Similarly, the sixth output control clock pulse i-CLK6 is a positive iso clock pulse of the sixth output clock pulse CLK6, and the third, fourth and fifth output control clock pulses i-CLK3, i-CLK4 and i-CLK5 are negative iso clock pulses of the sixth output clock pulse CLK6. Similarly, the seventh output control clock pulse i-CLK7 is a positive iso clock pulse of the seventh output clock pulse CLK7, and the fourth, fifth and sixth output control clock pulses i-CLK4, i-CLK5 and i-CLK6 are negative iso clock pulses of the seventh output clock pulse CLK7. Similarly, the eighth output control clock pulse i-CLK8 is a positive iso clock pulse of the eighth output clock pulse CLK8, and the fifth, sixth and seventh output control clock pulses i-CLK5, i-CLK6 and i-CLK7 are negative iso clock pulses of the eighth output clock pulse CLK8.

Particularly, among the negative iso clock pulses, negative iso clock pulses satisfying a condition that "a (k+2)-th output clock pulse falls during a high section of at least one output control clock pulse not overlapping with the high section of the k-th output clock pulse" may be defined as full negative iso clock pulses.

For example, the sixth, seventh and eighth output control clock pulses i-CLK6 to i-CLK8 are negative iso clock pulses of the first output clock pulse CLK1, and the sixth and seventh output control clock pulses i-CLK6 and i-CLK7 further satisfy the above-mentioned condition. Consequently, the sixth and seventh output control clock pulses i-CLK6 and i-CLK7 are full negative iso clock pulses of the first output clock pulse CLK1. Similarly, the seventh, eighth and first output control clock pulses i-CLK7, i-CLK8 and i-CLK1 are negative iso clock pulses of the second output clock pulse CLK2, and the seventh and eighth output control clock pulses i-CLK7 and i-CLK8 further satisfy the above-mentioned condition. Consequently, the seventh and eighth output control clock pulses i-CLK7 and i-CLK8 are full negative iso clock pulses of the second output clock pulse CLK2. Similarly, the eighth, first and second output control clock pulses i-CLK8, i-CLK1 and i-CLK2 are negative iso clock pulses of the third output clock pulse CLK3, and the first and eighth output control clock pulses i-CLK1 and i-CLK8 further satisfy the above-mentioned condition. Consequently, the first and eighth output control clock pulses i-CLK1 and i-CLK8 are full negative iso clock pulses of the third output clock pulse CLK3. Similarly, the first, second and third output control clock pulses i-CLK1, i-CLK2 and i-CLK3 are negative iso clock pulses of the fourth output clock pulse CLK4, and the first and second output control clock pulses i-CLK1 and i-CLK2 further satisfy the above-mentioned condition. Consequently, the first and second output control clock pulses i-CLK1 and i-CLK2 are full negative iso clock pulses of the fourth output clock pulse CLK4. Similarly, the second, third and fourth output control clock pulses i-CLK2, i-CLK3 and i-CLK4 are negative iso clock pulses of the fifth output clock pulse CLK5, and the second and third output control clock pulses i-CLK2 and i-CLK3 further satisfy the above-mentioned condition. Consequently, the second and third output control clock pulses i-CLK2 and i-CLK3 are full negative iso clock pulses of the fifth output clock pulse CLK5. Similarly, the third, fourth and fifth output control clock pulses i-CLK3, i-CLK4 and i-CLK5 are negative iso clock pulses of the sixth output clock pulse CLK6, and the third and fourth output control clock pulses i-CLK3 and i-CLK4 further satisfy the above-mentioned condition. Consequently, the third and fourth output control clock pulses i-CLK3 and i-CLK4 are full negative iso clock pulses of the sixth output clock pulse CLK6. Similarly, the fourth, fifth and sixth output control clock pulses i-CLK4, i-CLK5 and i-CLK6 are negative iso clock pulses of the seventh output clock pulse CLK7, and the fourth and fifth output control clock pulses i-CLK4 and i-CLK5 further satisfy the above-mentioned condition. Consequently, the fourth and fifth output control clock pulses i-CLK4 and i-CLK5 are full negative iso clock pulses of the seventh output clock pulse CLK7. Similarly, the fifth, sixth and seventh output control clock pulses i-CLK5, i-CLK6 and i-CLK7 are negative iso clock pulses of the eighth output clock pulse CLK8, and the fifth and sixth output control clock pulses i-CLK5 and i-CLK6 further satisfy the above-mentioned condition. Consequently, the fifth and sixth output control clock pulses i-CLK5 and i-CLK6 are full negative iso clock pulses of the eighth output clock pulse CLK8.

FIG. 4 shows the four-phase output clock pulses and output control clock pulses when b is 1, and FIG. 5 shows the eight-phase output clock pulses and output control clock pulses when b is 2.

Figure 1:
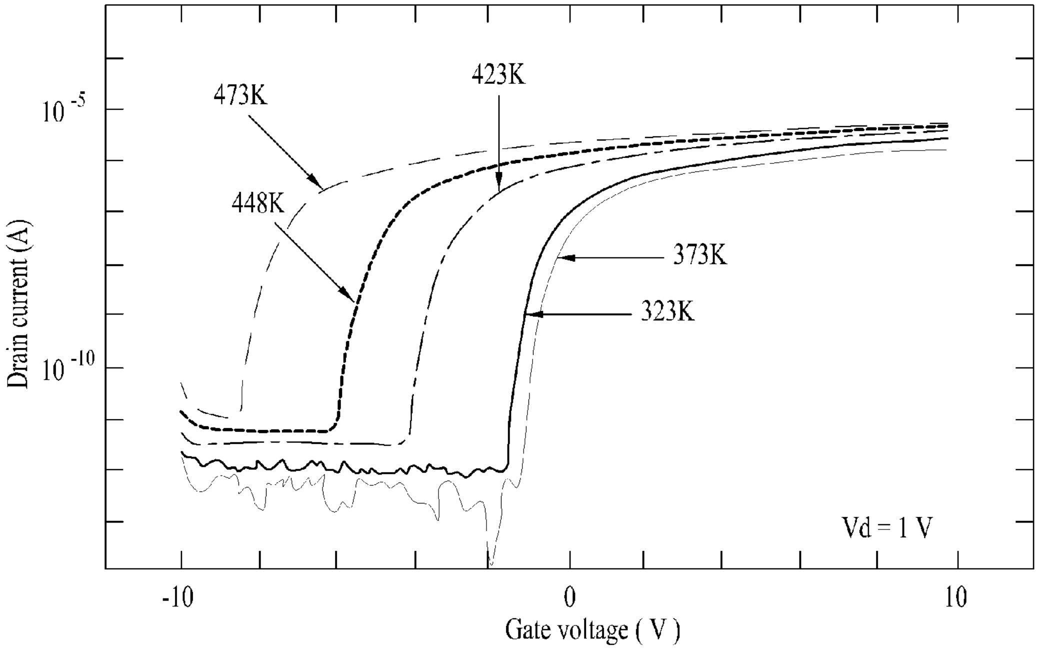
FIG. 1 Related Art
FIG. 1 is a view illustrating relational characteristics between a gate voltage and drain current of a conventional oxide semiconductor transistor based on temperature.
Figure 2:
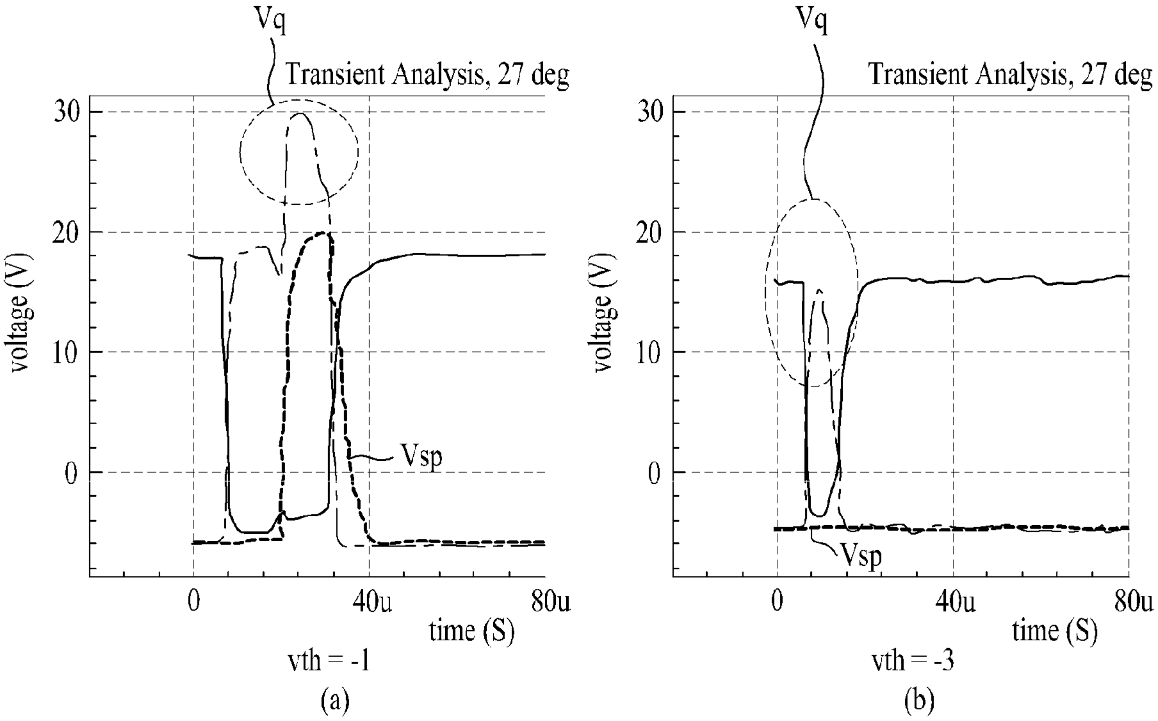
FIG. 2 Related Art
FIG. 2 is a view illustrating a voltage at a set node and a voltage of a scan pulse based on variation in a threshold voltage of a conventional oxide semiconductor transistor.

The output control clock pulses and the output clock pulses shown in FIG. 4 or FIG. 5 may be applied to the shift register of FIG. 1.

Figure 6:
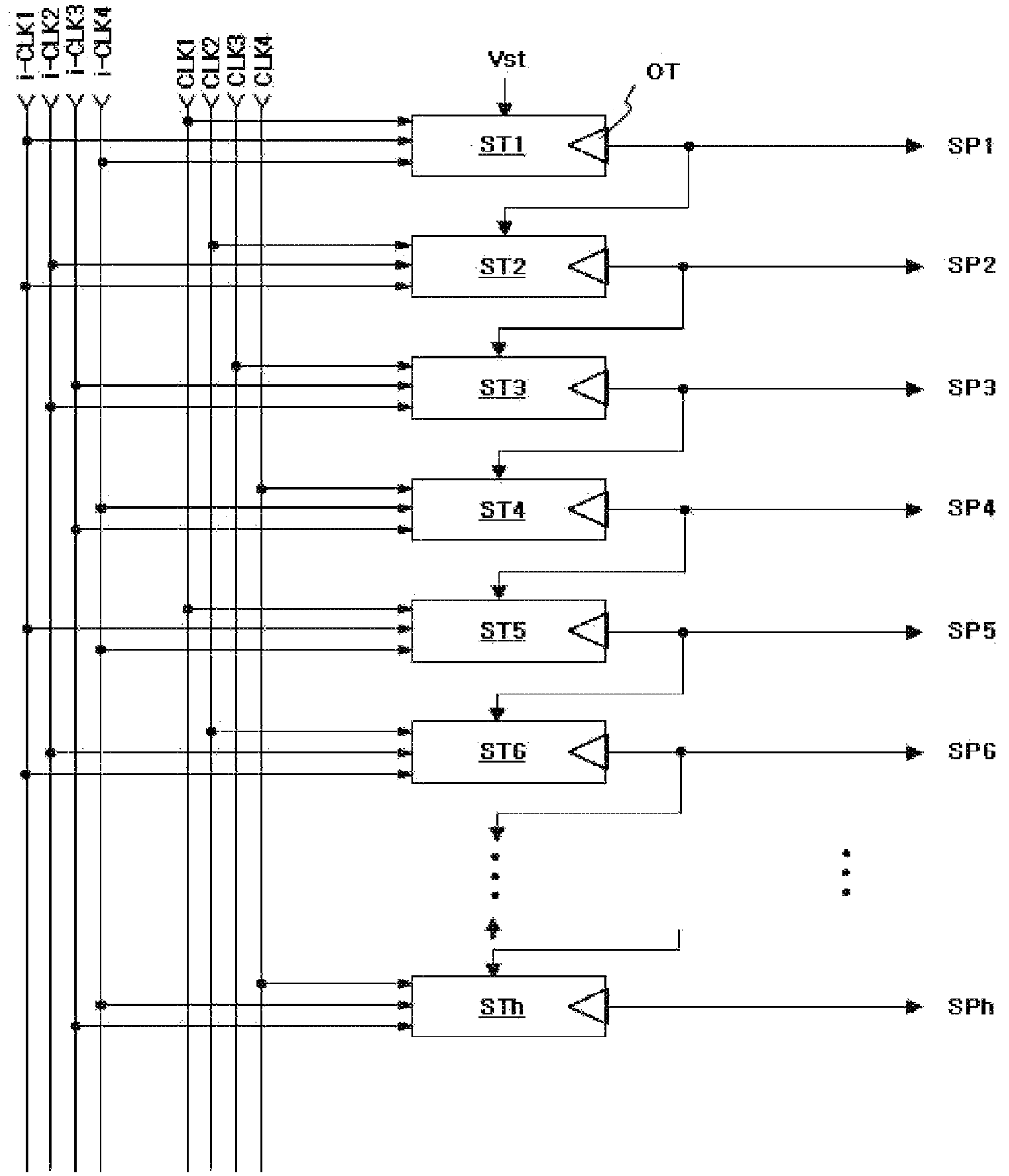
FIG. 6 is a view showing the construction of a shift register of FIG. 1 in detail.

FIG. 6 is a view showing the construction of the shift register SR of FIG. 1 in detail.

As shown in FIG. 6, the shift register SR includes h stages ST1 to STh. Each of the stages ST1 to STh outputs one scan pulse SP1 to SPh for one frame period through an output terminal OT thereof.

Each of the stages ST1 to STh drives a gate line connected thereto using the scan pulse. In addition, each of the stages ST1 to STh controls the operation of a stage downstream therefrom. Also, each of the stages ST1 to STh may control the operation of a stage upstream therefrom as well as the operation of a stage downstream therefrom based on the construction of the shift register. A dummy stage, which supplies a scan pulse to the h-th stage STh, is further provided downstream from the h-th stage STh. Several dummy stages may be provided based on the construction of the shift register.

The stages ST1 to STh sequentially output the scan pulses in order from the first stage ST1 to the h-th stage STh. That is, the first stage ST1 outputs the first scan pulse SP1, the second stage ST2 then outputs the second scan pulse SP2, the third stage ST3 then outputs the third scan pulse SP3 . . . and the h-th stage STh finally outputs the h-th scan pulse SPh.

The scan pulses output from the stages ST1 to STh, excluding the dummy stage, are sequentially supplied to gate lines of a liquid crystal panel (not shown) to sequentially scan the gate lines. Also, the scan pulse output from each of the stages is supplied only to an upstream stage, is supplied to the upstream stage and a downstream stage, or is supplied only to the downstream stage.

This shift register SR may be built in the liquid crystal panel. That is, the liquid crystal panel has a display region to display an image, and a non-display region surrounding the display region, and the shift register SR is built in the non-display region.

The stages ST1 to STh of the shift register SR, configured in this manner, are supplied with the above-mentioned output control clock pulses and output clock pulses. In FIG. 6, the first to fourth output clock pulses CLK1 to CLK4 and the first to fourth output control clock pulses i-CLK1 to i-CLK4 shown in FIG. 4 are supplied to the stages.

In FIG. 6, the p-th stage is supplied with a scan pulse from the (p−1)-th stage and a scan pulse from the (p+2)-th stage. Alternatively, the p-th stage may be supplied with a scan pulse from the (p−2)-th stage and a scan pulse from the (p+3)-th stage.

Also, in FIG. 6, the p-th stage is connected to an upstream stage and a downstream stage. Alternatively, the p-th stage may be connected to an upstream stage.

Hereinafter, the construction of each stage will be described in more detail.

FIGS. 7 to 13 are views showing constructions of stages according to first to seventh embodiments of the present invention. In each drawing, i-CLKa and i-CLKb indicate corresponding positive and full negative iso clock pulses of an output clock pulse. That is, i-CLKa indicates a positive iso clock pulse of CLKc, and i-CLKb indicates a full negative iso clock pulse of CLKc.

A description will be given on the assumption that the first to fourth output clock pulses CLK1 to CLK4 and the first to fourth output control clock pulses i-CLK1 to i-CLK4 shown in FIG. 4 are supplied to the stages of FIGS. 7 to 112.

The construction of a stage according to a first embodiment will be described with reference to FIG. 7.

Figure 7:
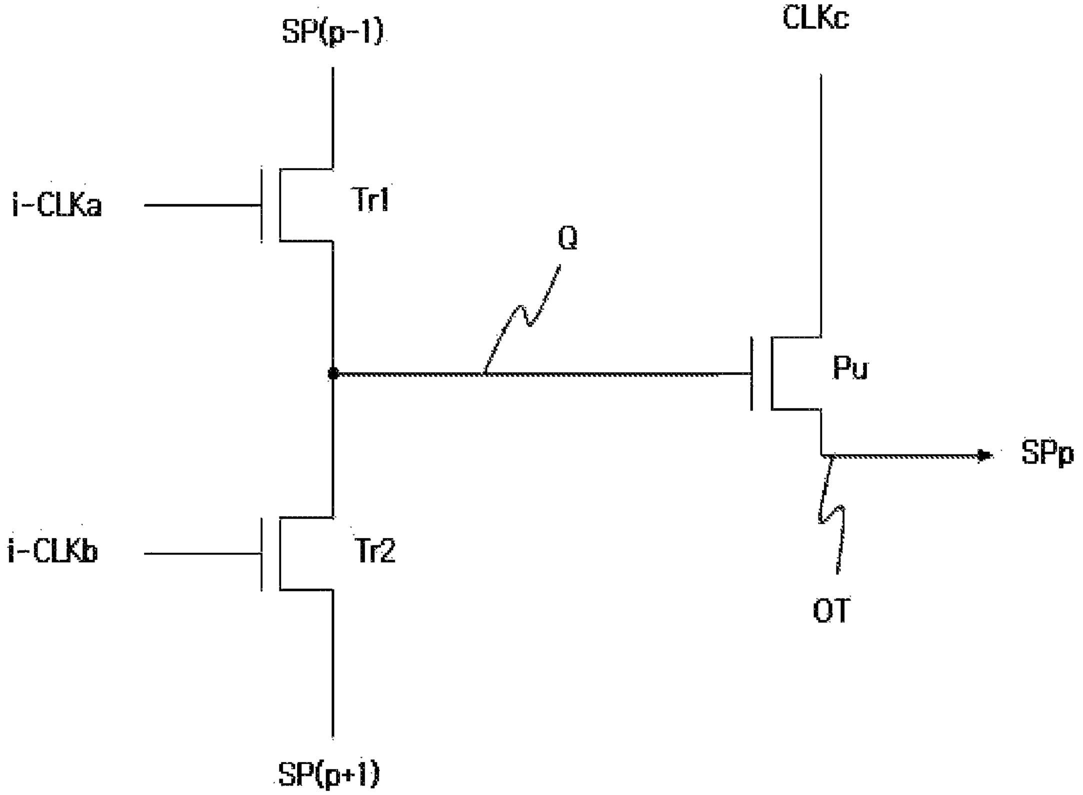
FIGS. 7 to 13 are views showing constructions of stages according to first to seventh embodiments of the present invention.

As shown in FIG. 7, a p-th stage includes a first switching device Tr1, a second switching device Tr2, and a pull-up switching device Pu.

The first switching device Tr1 included in the p-th stage is turned on or off according to one of the n output control clock pulses (a positive iso clock pulse i-CLKa) and interconnects an output terminal OT of a (p−1)-th stage and a set node Q when turned on. If the p-th stage is a first stage to which a start pulse is supplied, the first switching device Tr1 is connected to a first start transfer line instead of the output terminal OT of the (p−1)-th stage. A first start pulse is supplied to the first start transfer line.

The second switching device Tr2 included in the p-th stage is turned on or off according to one of the n output control clock pulses (a full negative iso clock pulse i-CLKb) and interconnects the set node Q and an output terminal OT of a (p+1)-th stage when turned on. If the p-th stage is a last stage to which a start pulse is supplied, the second switching device Tr2 is connected to a second start transfer line instead of the output terminal OT of the (p−1)-th stage. A second start pulse is supplied to the second start transfer line.

The pull-up switching device is turned on or off according to voltage applied to the set node Q and interconnects an output clock line and an output terminal OT of the p-th stage when turned on.

A k-th output clock pulse is supplied to the pull-up switching device, a k-th output control clock pulse is supplied to the first switching device Tr1, a high section of an output control clock pulse supplied to the second switching device Tr2 does not overlap with that of the k-th output clock pulse, and a (k+b)-th output clock pulse falls during the high section of the output control clock pulse supplied to the second switching device Tr2.

An output clock pulse CLKc is supplied to the output clock line connected to the pull-up switching device. If the p-th stage is a first stage ST1 and CLKc is a first output clock pulse CLK1, i-CLKa and i-CLKb may be a first output control clock pulse i-CLK1 and a fourth output control clock pulse i-CLK4, respectively.

A high section of the output control clock pulse supplied to the first switching device Tr1 may overlap with a high section of the output control clock pulse supplied to the second switching device Tr2 or may not.

Voltage of each of the first to fourth output clock pulses CLK1 to CLK4 supplied to the stage of FIG. 7 in a low section thereof may be set to be equal to or higher than voltage of each of the first to fourth output control clock pulses i-CLK1 to i-CLK4 in a low section thereof.

The first switching device Tr1 provided in the p-th stage of FIG. 7 may be connected to an output terminal OT of a (p−2)-th stage instead of the output terminal OT of the (p−1)-th stage. Also, the second switching device Tr2 provided in the p-th stage of FIG. 7 may be connected to an output terminal OT of a (p+2)-th stage instead of the output terminal OT of the (p+1)-th stage. In this case, the eight-phase output clock pulses and output control clock pulses shown in FIG. 5 are supplied to the stages having the above-mentioned structures. If the p-th stage is a first stage ST1 and CLKc is a first output clock pulse CLK1, i-CLKa may be a first output control clock pulse i-CLK1, and i-CLKb may be a sixth output control clock pulse i-CLK6 or a seventh output control clock pulse i-CLK7.

The construction of a stage according to a second embodiment will be described with reference to FIG. 8.

Figure 8:
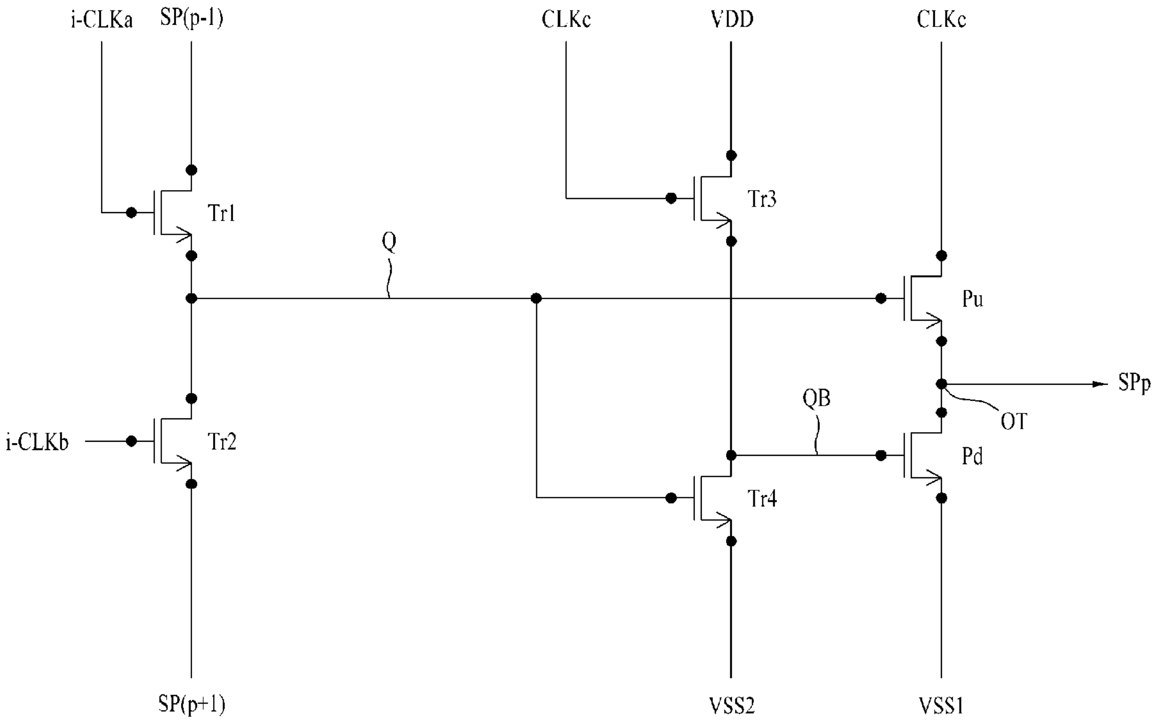

As shown in FIG. 8, a p-th stage includes first to fourth switching devices Tr1 to Tr4, a pull-up switching device Pu, and a pull-down switching device Pd.

The first switching device Tr1 included in the p-th stage is turned on or off according to one of the n output control clock pulses (a positive iso clock pulse i-CLKa) and interconnects an output terminal OT of a (p−1)-th stage and a set node Q when turned on. If the p-th stage is a first stage to which a start pulse is supplied, the first switching device Tr1 is connected to a first start transfer line instead of the output terminal OT of the (p−1)-th stage. A first start pulse is supplied to the first start transfer line.

The second switching device Tr2 included in the p-th stage is turned on or off according to one of the n output control clock pulses (a full negative iso clock pulse i-CLKb) and interconnects the set node Q and an output terminal OT of a (p+1)-th stage when turned on. If the p-th stage is a last stage to which a start pulse is supplied, the second switching device Tr2 is connected to a second start transfer line instead of the output terminal OT of the (p−1)-th stage. A second start pulse is supplied to the second start transfer line.

The third switching device Tr3 included in the p-th stage is turned on or off according to an output clock pulse from an output clock line and interconnects a charging voltage line transferring a charging voltage VDD and a reset node QB when turned on. On the other hand, the third switching device Tr3 may be connected to the charging voltage line instead of the output clock line.

The fourth switching device Tr4 included in the p-th stage is turned on or off according to voltage applied to the set node Q and interconnects the reset node QB and a second discharging voltage line transferring a second discharging voltage VSS2 when turned on.

The pull-up switching device Pu included in the p-th stage is turned on or off according to voltage applied to the set node Q and interconnects an output clock line and an output terminal OT of the p-th stage when turned on.

The pull-down switching device Pd included in the p-th stage is turned on or off according to voltage applied to the reset node QB and interconnects the output terminal OT of the p-th stage and a first discharging voltage line transferring a first discharging voltage VSS1 when turned on.

A k-th output clock pulse is supplied to the pull-up switching device Pu, a k-th output control clock pulse is supplied to the first switching device Tr1, a high section of an output control clock pulse supplied to the second switching device Tr2 does not overlap with that of the k-th output clock pulse, and a (k+b)-th output clock pulse falls during the high section of the output control clock pulse supplied to the second switching device Tr2.

The pull-up switching device Pu and the third switching device Tr3 are supplied with the same output clock pulse. Voltage of each of the output control clock pulses i-CLK1 to i-CLK4 in a low section thereof is lower than or equal to the first discharging voltage.

The first discharging voltage is equal to or different from the second discharging voltage. In this case, the first discharging voltage is lower or higher than the second discharging voltage.

An output clock pulse CLKc is supplied to the output clock line connected to the pull-up switching device Pu. If the p-th stage is a first stage ST1, the output clock pulses and output control clock pulses shown in FIG. 4 are supplied to the first stage ST1, and CLKc is a first output clock pulse CLK1, i-CLKa and i-CLKb may be a first output control clock pulse i-CLK1 and a fourth output control clock pulse i-CLK4, respectively.

A high section of the output control clock pulse supplied to the first switching device Tr1 may overlap with a high section of the output control clock pulse supplied to the second switching device Tr2 or may not.

Voltage of each of the first to fourth output clock pulses CLK1 to CLK4 supplied to the stage of FIG. 8 in a low section thereof may be set to be equal to or higher than voltage of each of the first to fourth output control clock pulses i-CLK1 to i-CLK4 in a low section thereof.

The first switching device Tr1 provided in the p-th stage of FIG. 8 may be connected to an output terminal OT of a (p−2)-th stage instead of the output terminal OT of the (p−1)-th stage. Also, the second switching device Tr2 provided in the p-th stage of FIG. 8 may be connected to an output terminal OT of a (p+2)-th stage instead of the output terminal OT of the (p+1)-th stage. In this case, the eight-phase output clock pulses and output control clock pulses shown in FIG. 5 are supplied to the stages having the above-mentioned structures. If the p-th stage is a first stage ST1 and CLKc is a first output clock pulse CLK1, i-CLKa may be a first output control clock pulse i-CLK1, and i-CLKb may be a sixth output control clock pulse i-CLK6 or a seventh output control clock pulse i-CLK7.

The construction of a stage according to a third embodiment will be described with reference to FIG. 9.

Figure 9:
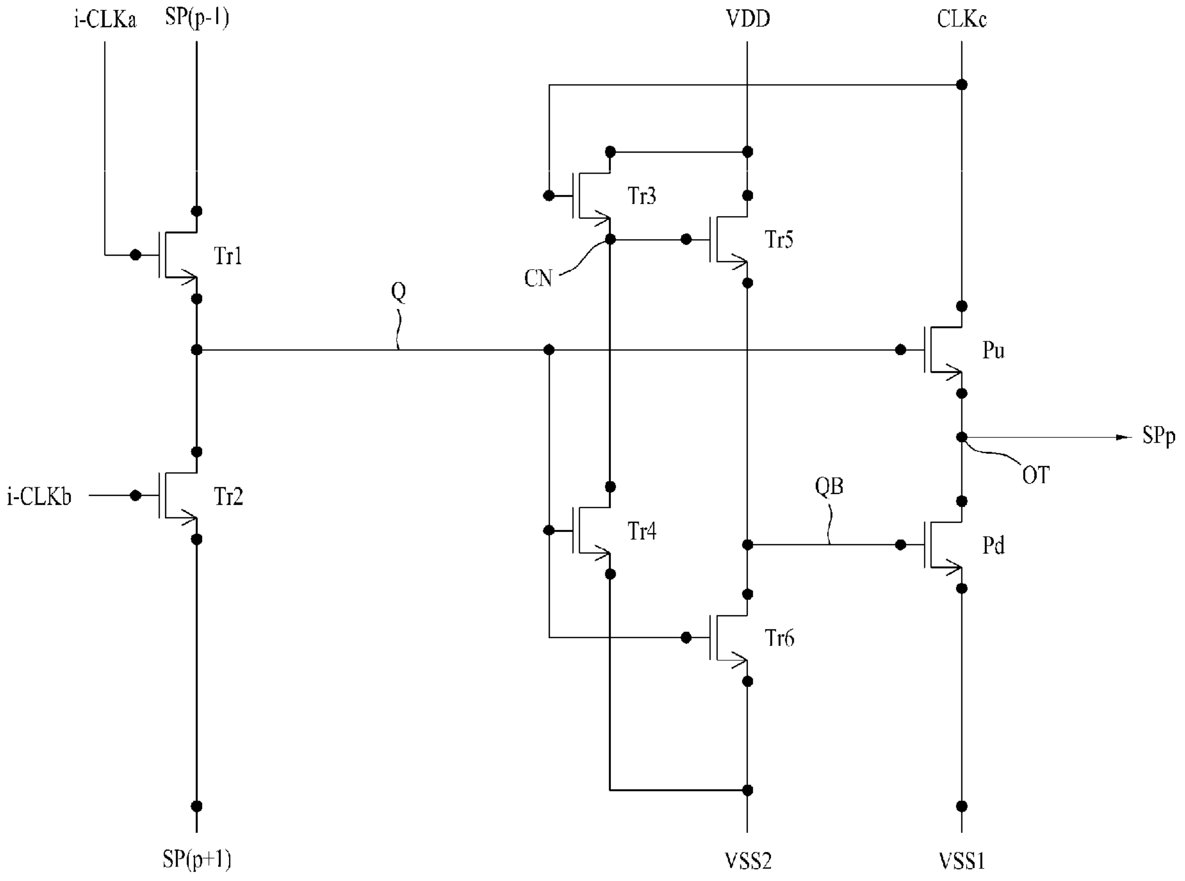

As shown in FIG. 9, a p-th stage includes first to sixth switching devices Tr1 to Tr6, a pull-up switching device Pu, and a pull-down switching device Pd.

The first switching device Tr1 included in the p-th stage is turned on or off according to one of the n output control clock pulses (a positive iso clock pulse i-CLKa) and interconnects an output terminal OT of a (p−1)-th stage and a set node Q when turned on.

The second switching device Tr2 included in the p-th stage is turned on or off according to one of the n output control clock pulses (a full negative iso clock pulse i-CLKb) and interconnects the set node Q and an output terminal OT of a (p+1)-th stage when turned on.

The third switching device Tr3 included in the p-th stage is turned on or off according to an output clock pulse from an output clock line and interconnects a charging voltage line transferring a charging voltage VDD and a common node CN when turned on. The third switching device Tr3 may be connected to the charging voltage line instead of the output clock line.

The fourth switching device Tr4 included in the p-th stage is turned on or off according to voltage applied to the set node Q and interconnects the common node CN and a second discharging voltage line transferring a second discharging voltage VSS2 when turned on.

The fifth switching device Tr5 included in the p-th stage is turned on or off according to voltage applied to the common node and interconnects the charging voltage line and a reset node QB when turned on.

The sixth switching device Tr6 included in the p-th stage is turned on or off according to voltage applied to the set node Q and interconnects the reset node QB and the second discharging voltage line when turned on.

The pull-up switching device Pu included in the p-th stage is turned on or off according to voltage applied to the set node Q and interconnects an output clock line and an output terminal OT of the p-th stage when turned on.

The pull-down switching device Pd included in the p-th stage is turned on or off according to voltage applied to the reset node QB and interconnects the output terminal OT of the p-th stage and a first discharging voltage line transferring a first discharging voltage VSS1 when turned on.

A k-th output clock pulse is supplied to the pull-up switching device Pu, a k-th output control clock pulse is supplied to the first switching device Tr1, a high section of an output control clock pulse supplied to the second switching device Tr2 does not overlap with that of the k-th output clock pulse, and a (k+b)-th output clock pulse falls during the high section of the output control clock pulse supplied to the second switching device Tr2.

An output clock pulse CLKc is supplied to the output clock line connected to the pull-up switching device Pu. If the p-th stage is a first stage ST1, the output clock pulses and output control clock pulses shown in FIG. 4 are supplied to the first stage ST1, and CLKc is a first output clock pulse CLK1, i-CLKa and i-CLKb may be a first output control clock pulse i-CLK1 and a fourth output control clock pulse i-CLK4, respectively.

The first and second discharging voltages VSS1 and VSS2 of the third embodiment may have the same properties as those of the second embodiment.

The first switching device Tr1 provided in the p-th stage of FIG. 9 may be connected to an output terminal OT of a (p−2)-th stage instead of the output terminal OT of the (p−1)-th stage. Also, the second switching device Tr2 provided in the p-th stage of FIG. 9 may be connected to an output terminal OT of a (p+2)-th stage instead of the output terminal OT of the (p+1)-th stage. In this case, the eight-phase output clock pulses and output control clock pulses shown in FIG. 5 are supplied to the stages having the above-mentioned structures. If the p-th stage is a first stage ST1 and CLKc is a first output clock pulse CLK1, i-CLKa may be a first output control clock pulse i-CLK1, and i-CLKb may be a sixth output control clock pulse i-CLK6 or a seventh output control clock pulse i-CLK7.

The construction of a stage according to a fourth embodiment will be described with reference to FIG. 10.

Figure 10:
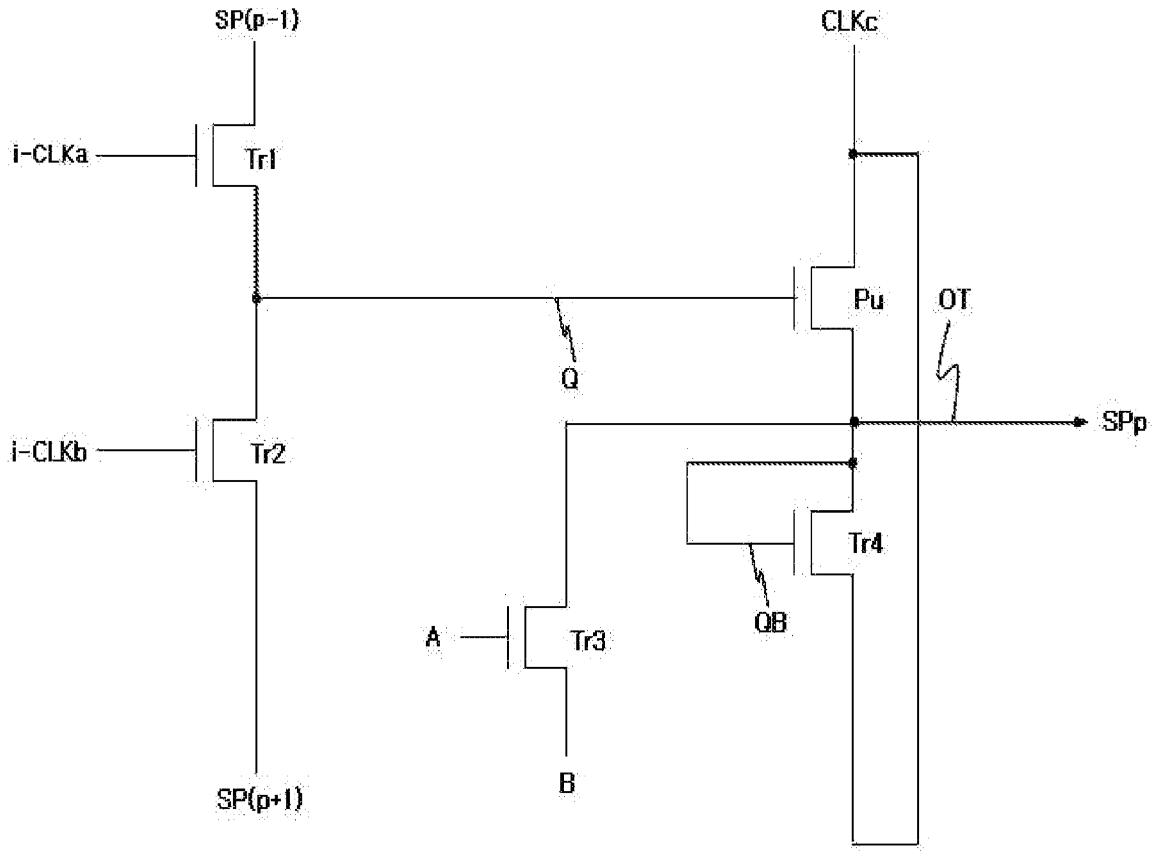

As shown in FIG. 10, a p-th stage includes first to fourth switching devices Tr1 to Tr4 and a pull-up switching device Pu.

The first switching device Tr1 included in the p-th stage is turned on or off according to one of the n output control clock pulses (a positive iso clock pulse i-CLKa) and interconnects an output terminal OT of a (p−1)-th stage and a set node Q when turned on. If the p-th stage is a first stage to which a start pulse is supplied, the first switching device Tr1 is connected to a first start transfer line instead of the output terminal OT of the (p−1)-th stage. A first start pulse is supplied to the first start transfer line.

The second switching device Tr2 included in the p-th stage is turned on or off according to one of the n output control clock pulses (a full negative iso clock pulse i-CLKb) and interconnects the set node Q and an output terminal OT of a (p+1)-th stage when turned on. If the p-th stage is a last stage to which a start pulse is supplied, the second switching device Tr2 is connected to a second start transfer line instead of the output terminal OT of the (p−1)-th stage. A second start pulse is supplied to the second start transfer line.

The third switching device Tr3 included in the p-th stage is turned on or off according to an output control clock pulse (a negative iso clock pulse) from an output control clock line or an output clock pulse from an output clock line and interconnects an output terminal OT of the p-th stage and a discharging voltage line transferring a discharging voltage when turned on. On the other hand, the third switching device Tr3 included in the p-th stage may be turned on or off according to an output control clock pulse (a negative iso clock pulse) from an output control clock line or an output clock pulse from an output clock line and may interconnect the output terminal OT of the p-th stage and one of the output clock lines when turned on. That is, a negative iso clock pulse or an output clock pulse may be supplied to a gate electrode of the third switching device Tr3 indicated by A in FIG. 10. Also, a discharging voltage or an output clock pulse may be supplied to a source electrode of the third switching device Tr3 indicated by B in FIG. 10. The output clock pulse supplied to A or B is equal to that supplied to the pull-up switching device Pu of the p-th stage. Meanwhile, the negative iso clock pulse supplied to A is equal to a full negative iso clock pulse in the four-phase case as described above.

The fourth switching device Tr4 included in the p-th stage is turned on or off according to voltage from the output terminal OT of the p-th stage and interconnects the output terminal OT and an output clock line when turned on.

The pull-up switching device Pu included in the p-th stage is turned on or off according to voltage applied to the set node Q and interconnects an output clock line and the output terminal OT of the p-th stage when turned on.

A k-th output clock pulse is supplied to the pull-up switching device Pu, a k-th output control clock pulse is supplied to the first switching device Tr1, a high section of an output control clock pulse supplied to the second switching device Tr2 does not overlap with that of the k-th output clock pulse, a (k+b)-th output clock pulse falls during the high section of the output control clock pulse supplied to the second switching device Tr2, and a high section of an output control clock pulse supplied to the third switching device Tr3 does not overlap with that of the k-th output clock pulse.

An output clock pulse CLKc is supplied to the output clock line connected to the pull-up switching device Pu. If the p-th stage is a first stage ST1, the output clock pulses and output control clock pulses shown in FIG. 4 are supplied to the first stage ST1, and CLKc is a first output clock pulse CLK1, i-CLKa and i-CLKb may be a first output control clock pulse i-CLK1 and a fourth output control clock pulse i-CLK4, respectively. Also, the fourth output control clock pulse i-CLK4 is supplied to A.

A high section of the output control clock pulse supplied to the first switching device Tr1 may overlap with high section of the output control clock pulse supplied to the second switching device Tr2 or may not.

Voltage of each of the first to fourth output clock pulses CLK1 to CLK4 supplied to the stage of FIG. 10 in a low section thereof may be set to be equal to or higher than voltage of each of the first to fourth output control clock pulses i-CLK1 to i-CLK4 in a low section thereof.

The first switching device Tr1 provided in the p-th stage of FIG. 10 may be connected to an output terminal OT of a (p−2)-th stage instead of the output terminal OT of the (p−1)-th stage. Also, the second switching device Tr2 provided in the p-th stage of FIG. 10 may be connected to an output terminal OT of a (p+2)-th stage instead of the output terminal OT of the (p+1)-th stage. In this case, the eight-phase output clock pulses and output control clock pulses shown in FIG. 5 are supplied to the stages having the above-mentioned structures. If the p-th stage is a first stage ST1 and CLKc is a first output clock pulse CLK1, i-CLKa may be a first output control clock pulse i-CLK1, and i-CLKb may be a sixth output control clock pulse i-CLK6 or a seventh output control clock pulse i-CLK7. Also, one of the sixth, seventh and eighth output control clock pulses i-CLK6 to i-CLK8, which are negative iso clock pulses, may be applied to A.

The construction of a stage according to a fifth embodiment will be described with reference to FIG. 11.

Figure 11:
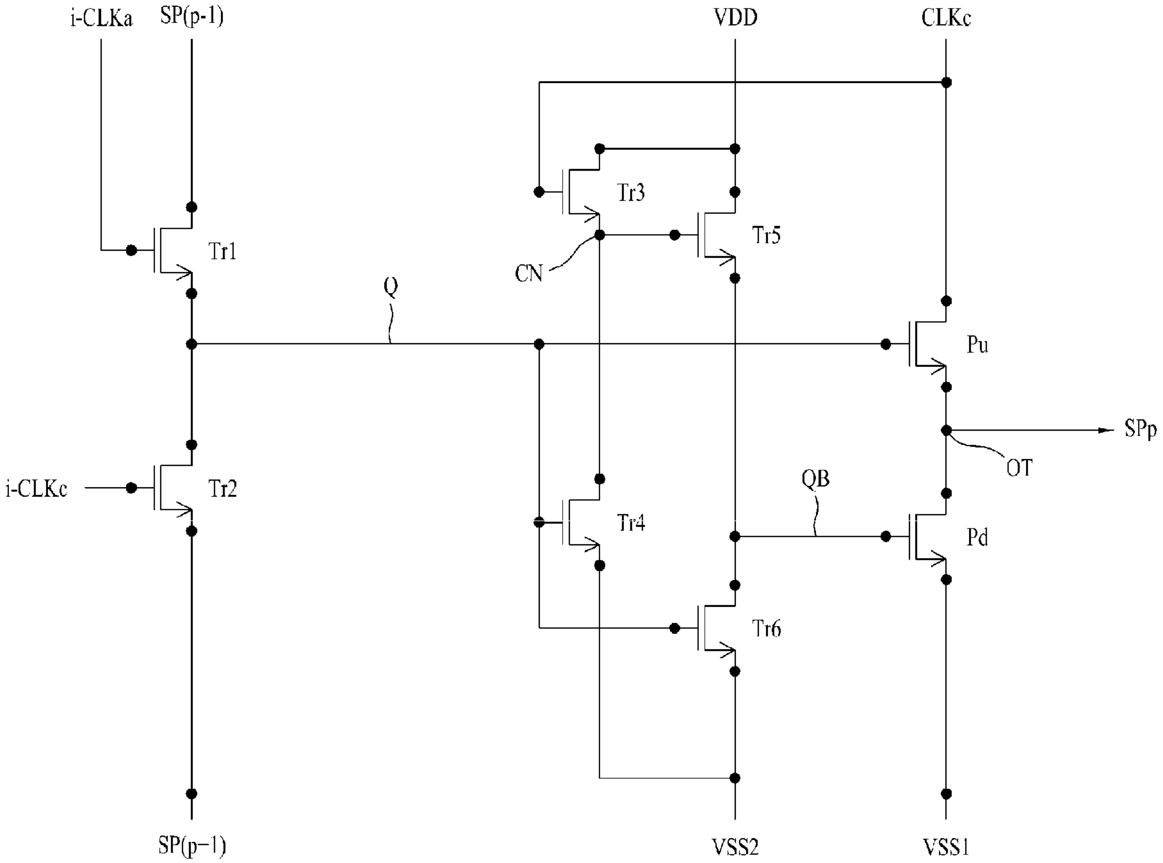

As shown in FIG. 11, a p-th stage includes first to sixth switching devices Tr1 to Tr6, a pull-up switching device Pu, and a pull-down switching device Pd.

The first switching device Tr1 included in the p-th stage is turned on or off according to one of the n output control clock pulses (a positive iso clock pulse i-CLKa) and interconnects an output terminal OT of a (p−1)-th stage and a set node Q when turned on.

The second switching device Tr2 included in the p-th stage is turned on or off according to one of the n output control clock pulses (a modified full negative iso clock pulse i-CLKc) and interconnects the set node Q and an output terminal OT of a (p+1)-th stage when turned on. A modified full negative iso clock pulse is supplied to a gate electrode of the second switching device Tr2. The modified full negative iso clock pulse is an output control clock pulse included in a high section of an output clock pulse used as an output of the (p+1)-th stage among the above-mentioned full negative iso clock pulses. For example, when the clock pulses shown in FIG. 4 are used, the third output control clock pulse i-CLK3 is supplied to a gate electrode of the second switching device Tr2 included in the first stage ST1, the fourth output control clock pulse i-CLK4 is supplied to a gate electrode of the second switching device Tr2 included in the second stage ST2, the first output control clock pulse i-CLK1 is supplied to a gate electrode of the second switching device Tr2 included in the third stage ST3, and the second output control clock pulse i-CLK2 is supplied to a gate electrode of the second switching device Tr2 included in the fourth stage ST4. At this time, the first output control clock pulse i-CLK1 and the first output clock pulse CLK1 are respectively supplied to the first switching device Tr1 and the pull-up switching device Pu of the first stage ST1, the second output control clock pulse i-CLK2 and the second output clock pulse CLK2 are respectively supplied to the first switching device Tr1 and the pull-up switching device Pu of the second stage ST2, the third output control clock pulse i-CLK3 and the third output clock pulse CLK3 are respectively supplied to the first switching device Tr1 and the pull-up switching device Pu of the third stage ST3, and the fourth output control clock pulse i-CLK4 and the fourth output clock pulse CLK4 are respectively supplied to the first switching device Tr1 and the pull-up switching device Pu of the fourth stage ST4.

The third switching device Tr3 included in the p-th stage is turned on or off according to an output clock pulse from an output clock line and interconnects a charging voltage line transferring a charging voltage VDD and a common node CN when turned on.

The fourth switching device Tr4 included in the p-th stage is turned on or off according to voltage applied to the set node Q and interconnects the common node CN and a second discharging voltage line transferring a second discharging voltage VSS2 when turned on.

The fifth switching device Tr5 included in the p-th stage is turned on or off according to voltage applied to the common node CN and interconnects the charging voltage line and a reset node QB when turned on.

The sixth switching device Tr6 included in the p-th stage is turned on or off according to voltage applied to the set node Q and interconnects the reset node QB and the second discharging voltage line when turned on.

The pull-up switching device Pu included in the p-th stage is turned on or off according to voltage applied to the set node Q and interconnects an output clock line and an output terminal OT of the p-th stage when turned on.

The pull-down switching device Pd included in the p-th stage is turned on or off according to voltage applied to the reset node QB and interconnects the output terminal OT of the p-th stage and a first discharging voltage line transferring a first discharging voltage VSS1 when turned on.

A k-th output clock pulse is supplied to the pull-up switching device Pu, a k-th output control clock pulse is supplied to the first switching device Tr1, a high section of an output control clock pulse supplied to the second switching device Tr2 does not overlap with that of the k-th output clock pulse, a (k+b)-th output clock pulse falls during the high section of the output control clock pulse supplied to the second switching device Tr2, and the high section of the output control clock pulse supplied to the second switching device Tr2 may be included in that of an output clock pulse used as an output of a (p+r)-th stage. When the clock pulses shown in FIG. 4 are used, r is 1.

The first and second discharging voltages VSS1 and VSS2 are equal to those of each of the previous embodiments.

The construction of a stage according to a sixth embodiment will be described with reference to FIG. 12.

Figure 12:
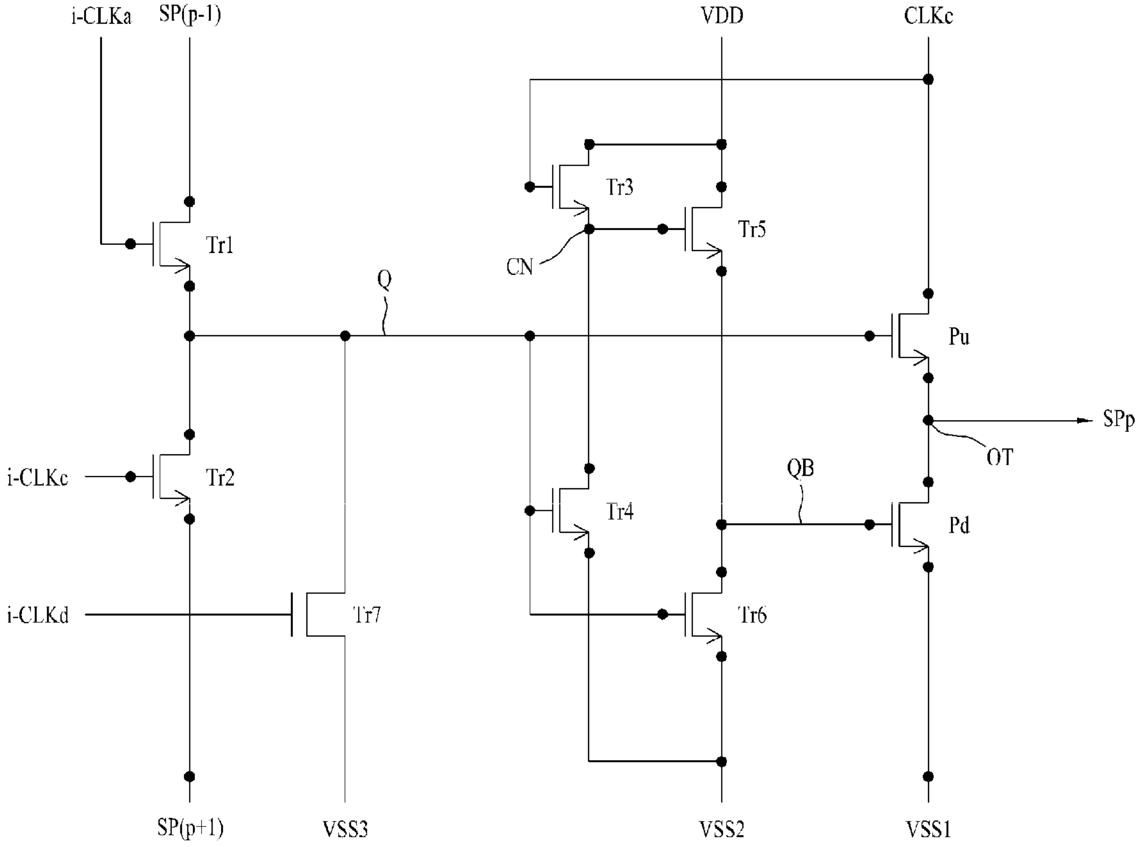

As shown in FIG. 12, a p-th stage includes first to seventh switching devices Tr1 to Tr7, a pull-up switching device Pu, and a pull-down switching device Pd.

The first switching device Tr1 included in the p-th stage is turned on or off according to one of the n output control clock pulses (a positive iso clock pulse i-CLKa) and interconnects an output terminal OT of a (p−1)-th stage and a set node Q when turned on.

The second switching device Tr2 included in the p-th stage is turned on or off according to one of the n output control clock pulses (a modified full negative iso clock pulse i-CLKc) and interconnects the set node Q and an output terminal OT of a (p+1)-th stage when turned on. A modified full negative iso clock pulse is supplied to a gate electrode of the second switching device Tr2. The modified full negative iso clock pulse is an output control clock pulse included in a high section of an output clock pulse used as an output of the (p+1)-th stage among the above-mentioned full negative iso clock pulses. For example, when the clock pulses shown in FIG. 4 are used, the third output control clock pulse i-CLK3 is supplied to a gate electrode of the second switching device Tr2 included in the first stage ST1, the fourth output control clock pulse i-CLK4 is supplied to a gate electrode of the second switching device Tr2 included in the second stage ST2, the first output control clock pulse i-CLK1 is supplied to a gate electrode of the second switching device Tr2 included in the third stage ST3, and the second output control clock pulse i-CLK2 is supplied to a gate electrode of the second switching device Tr2 included in the fourth stage ST4. At this time, the first output control clock pulse i-CLK1 and the first output clock pulse CLK1 are respectively supplied to the first switching device Tr1 and the pull-up switching device Pu of the first stage ST1, the second output control clock pulse i-CLK2 and the second output clock pulse CLK2 are respectively supplied to the first switching device Tr1 and the pull-up switching device Pu of the second stage ST2, the third output control clock pulse i-CLK3 and the third output clock pulse CLK3 are respectively supplied to the first switching device Tr1 and the pull-up switching device Pu of the third stage ST3, and the fourth output control clock pulse i-CLK4 and the fourth output clock pulse CLK4 are respectively supplied to the first switching device Tr1 and the pull-up switching device Pu of the fourth stage ST4.

The third switching device Tr3 included in the p-th stage is turned on or off according to an output clock pulse from an output clock line and interconnects a charging voltage line transferring a charging voltage VDD and a common node CN when turned on.

The fourth switching device Tr4 included in the p-th stage is turned on or off according to voltage applied to the set node Q and interconnects the common node and a second discharging voltage line transferring a second discharging voltage VSS2 when turned on.

The fifth switching device Tr5 included in the p-th stage is turned on or off according to voltage applied to the common node CN and interconnects the charging voltage line and a reset node QB when turned on.

The sixth switching device Tr6 included in the p-th stage is turned on or off according to voltage applied to the set node Q and interconnects the reset node QB and the second discharging voltage line when turned on.

The seventh switching device Tr7 included in the p-th stage is turned on or off according to one of the n output control clock pulses (a negative iso clock pulse i-CLKd) and interconnects the set node Q and a third discharging voltage line transferring a third discharging voltage VSS3 when turned on.

The pull-up switching device Pu included in the p-th stage is turned on or off according to voltage applied to the set node Q and interconnects an output clock line and an output terminal OT of the p-th stage when turned on.

The pull-down switching device Pd included in the p-th stage is turned on or off according to voltage applied to the reset node QB and interconnects the output terminal OT of the p-th stage and a first discharging voltage line transferring a first discharging voltage VSS1 when turned on.

A k-th output clock pulse is supplied to the pull-up switching device Pu, a k-th output control clock pulse is supplied to the first switching device Tr1, a high section of an output control clock pulse supplied to the second switching device Tr2 does not overlap with that of the k-th output clock pulse, a (k+b)-th output clock pulse falls during the high section of the output control clock pulse supplied to the second switching device Tr2, and the high section of the output control clock pulse supplied to the second switching device Tr2 may be included in that of an output clock pulse used as an output of a (p+r)-th stage. When the clock pulses shown in FIG. 4 are used, r is 1.

The first discharging voltage VSS1 is equal to or different from the second discharging voltage VSS2. In this case, the first discharging voltage VSS1 is lower or higher than the second discharging voltage VSS2. Alternatively, the first to third discharging voltages VSS1 to VSS3 may be the same. As another alternative, two of the first to third discharging voltages VSS1 to VSS3 may be the same.

The construction of a stage according to a seventh embodiment will be described with reference to FIG. 13.

Figure 13:
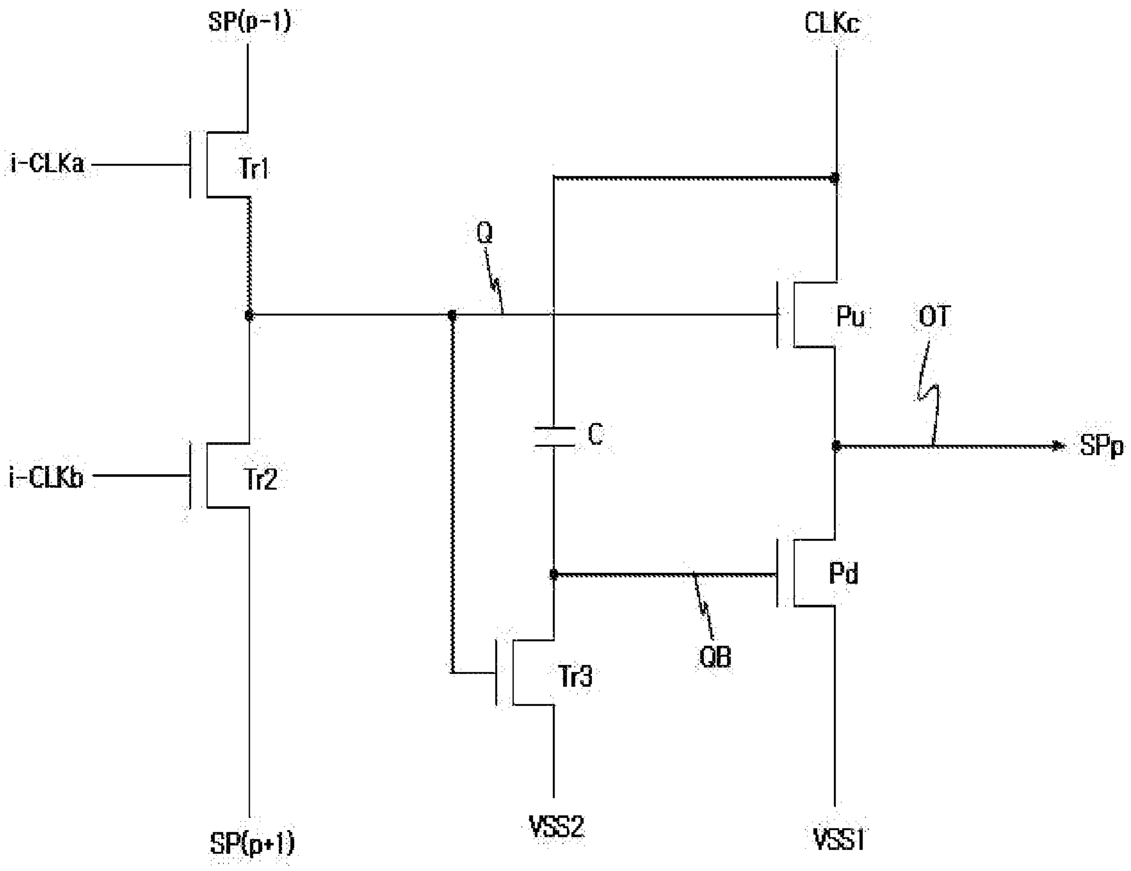

As shown in FIG. 13, a p-th stage includes first to third switching devices Tr1 to Tr3, a pull-up switching device Pu, a pull-down switching device Pd, and a capacitor C.

The first switching device Tr1 included in the p-th stage is turned on or off according to one of the n output control clock pulses (a positive iso clock pulse i-CLKa) and interconnects an output terminal of a (p−q)-th (q being a natural number less than p) stage and a set node Q when turned on. If the p-th stage is a first stage to which a start pulse is supplied, the first switching device Tr1 is connected to a first start transfer line instead of an output terminal OT of a (p−1)-th stage. A first start pulse is supplied to the first start transfer line.

The second switching device Tr2 included in the p-th stage is turned on or off according to one of the n output control clock pulses (a full negative iso clock pulse i-CLKb) and interconnects the set node Q and an output terminal OT of a (p+r)-th (r being a natural number) stage when turned on. If the p-th stage is a last stage to which a start pulse is supplied, the second switching device Tr2 is connected to a second start transfer line instead of the output terminal OT of the (p−1)-th stage. A second start pulse is supplied to the second start transfer line.

The third switching device Tr3 included in the p-th stage is turned on or off according to voltage applied to the set node Q and interconnects a reset node QB and a second discharging voltage line transferring a second discharging voltage VSS2 when turned on.

The pull-up switching device Pu included in the p-th stage is turned on or off according to voltage applied to the set node Q and interconnects an output clock line and an output terminal OT of the p-th stage when turned on.

The pull-down switching device Pd included in the p-th stage is turned on or off according to voltage applied to the reset node QB and interconnects the output terminal OT of the p-th stage and a first discharging voltage line transferring a first discharging voltage VSS1 when turned on.

The capacitor C included in the p-th stage is connected between an output clock line and the reset node QB.

A k-th output clock pulse is supplied to the pull-up switching device Pu, a k-th output control clock pulse is supplied to the first switching device Tr1, a high section of an output control clock pulse supplied to the second switching device Tr2 does not overlap with that of the k-th output clock pulse, a (k+b)-th output clock pulse falls during the high section of the output control clock pulse supplied to the second switching device Tr2, and an output clock pulse supplied to the capacitor C is equal to that supplied to the pull-up switching device Pu.

An output clock pulse CLKc is supplied to the output clock line connected to the pull-up switching device Pu. If the p-th stage is a first stage ST1 and CLKc is a first output clock pulse CLK1, i-CLKa and i-CLKb may be a first output control clock pulse i-CLK1 and a fourth output control clock pulse i-CLK4, respectively.

A high section of the output control clock pulse supplied to the first switching device Tr1 may overlap with a high section of the output control clock pulse supplied to the second switching device Tr2 or may not.

Figure 14:
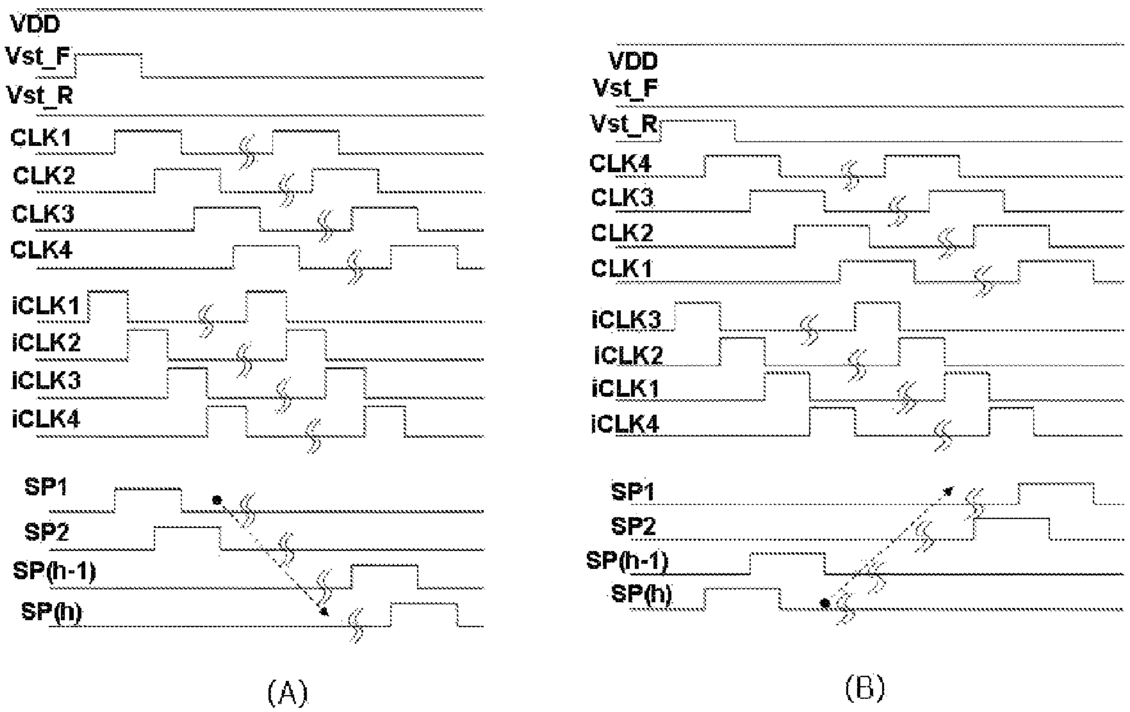
FIG. 14 is a view showing forward clock pulses and reverse clock pulses.

FIG. 14 is a view showing forward clock pulses and reverse clock pulses.

In the present invention, n output clock pulses include n forward output clock pulses, which are forwardly output, and n reverse output clock pulses, which are reversely output.

Also, n output control clock pulses include n forward output control clock pulses, which are forwardly output, and n reverse output control clock pulses, which are reversely output.

FIG. 14(A) is a view showing forward output clock pulses and forward output control clock pulses. FIG. 14(A) is substantially the same as FIG. 4. FIG. 14(B) is a view showing reverse output clock pulses and reverse output control clock pulses. The reverse output clock pulses and the reverse output control clock pulses are reversely output so as to satisfy conditions of the above-mentioned positive iso clock pulses, negative iso clock pulses and full negative iso clock pulses.

Start pulses include a first start pulse Vst_F and a second start pulse Vst_R. In a forward driving mode, in which stages are sequentially driven from a first stage to an h-th stage, the first start pulse is high, and the second start pulse is low. On the other hand, in a reverse driving mode, in which the stages are sequentially driven from the h-th stage to the first stage, the first start pulse is low, and the second start pulse is high. For example, when the stages having the circuits of FIG. 7 are reversely driven, a full negative iso clock pulse is supplied to a gate electrode of the first switching device Tr1, and a positive iso clock pulse is supplied to a gate electrode of the second switching device Tr2.

Figure 15:
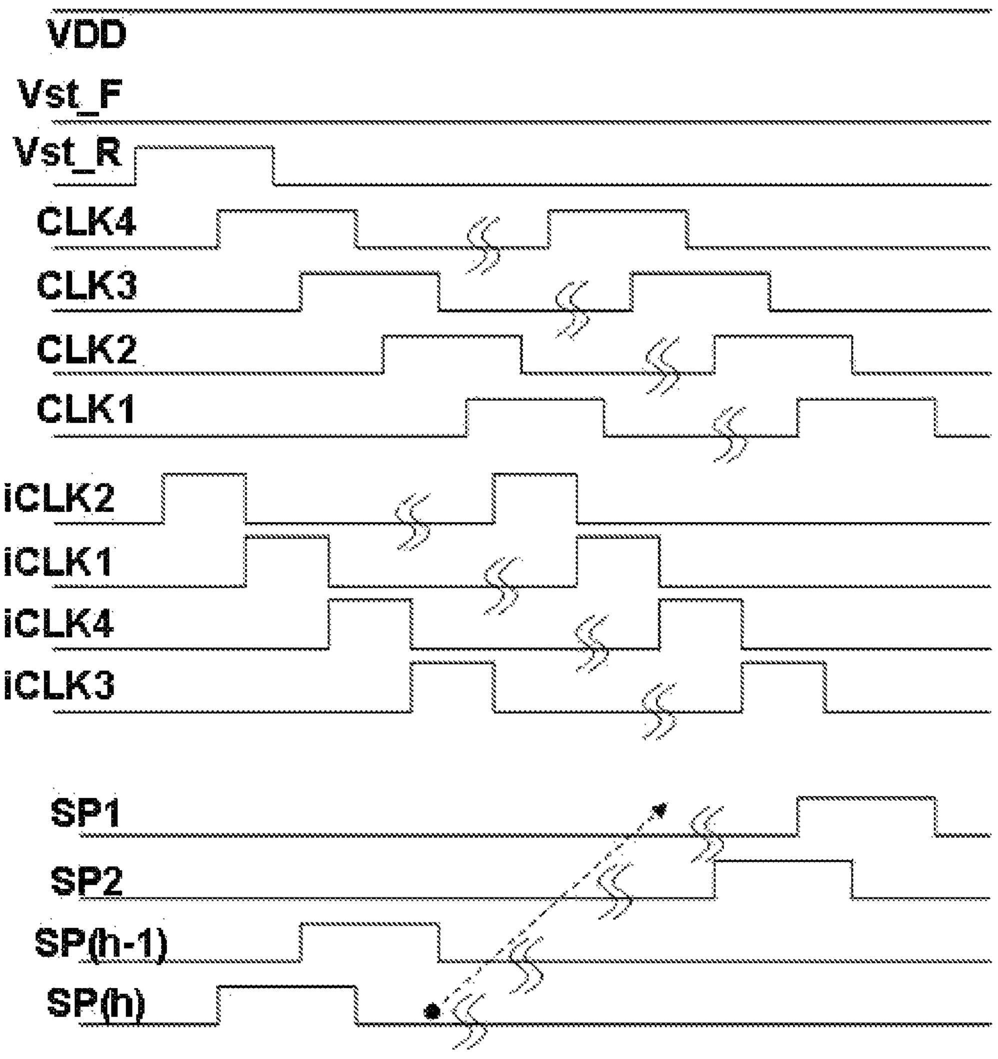
FIG. 15 is a view showing waveforms of reverse clock pulses supplied to the structure of FIG. 11.

FIG. 15 is a view showing waveforms of reverse clock pulses supplied to the structure of FIG. 11. A first output control clock pulse i-CLK1 may be supplied to the second switching device Tr2 included in this stage. It can be seen that the first output control clock pulse i-CLK1 is included in a high section of a fourth output clock pulse CLK4.

Figure 16:
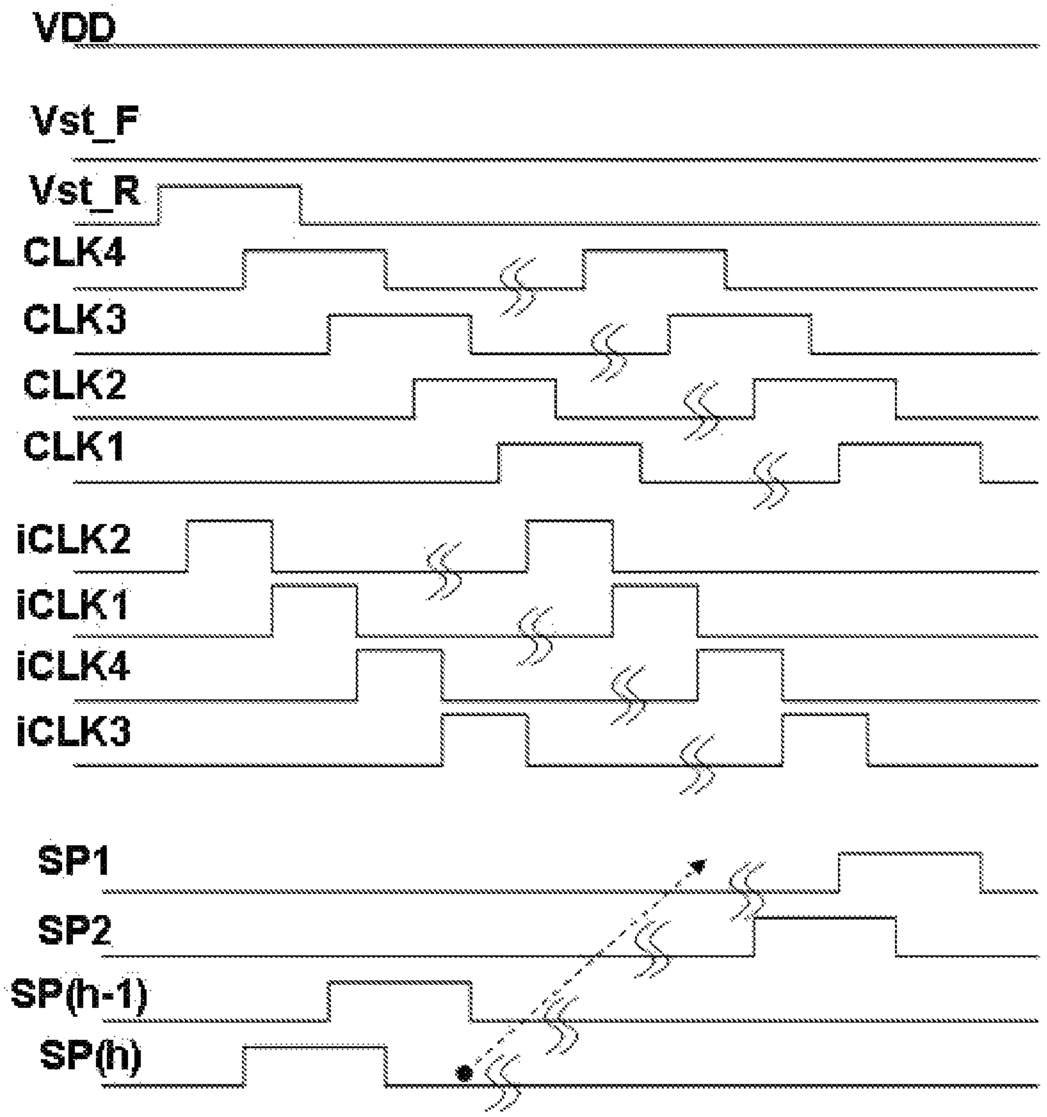
FIG. 16 is a view showing waveforms of reverse clock pulses supplied to the structure of FIG. 12.

FIG. 16 is a view showing waveforms of reverse clock pulses supplied to the structure of FIG. 12. A first output control clock pulse i-CLK1 may be supplied to the second switching device Tr2 included in this stage. It can be seen that the first output control clock pulse i-CLK1 is included in a high section of a fourth output clock pulse CLK4.

Figure 17:
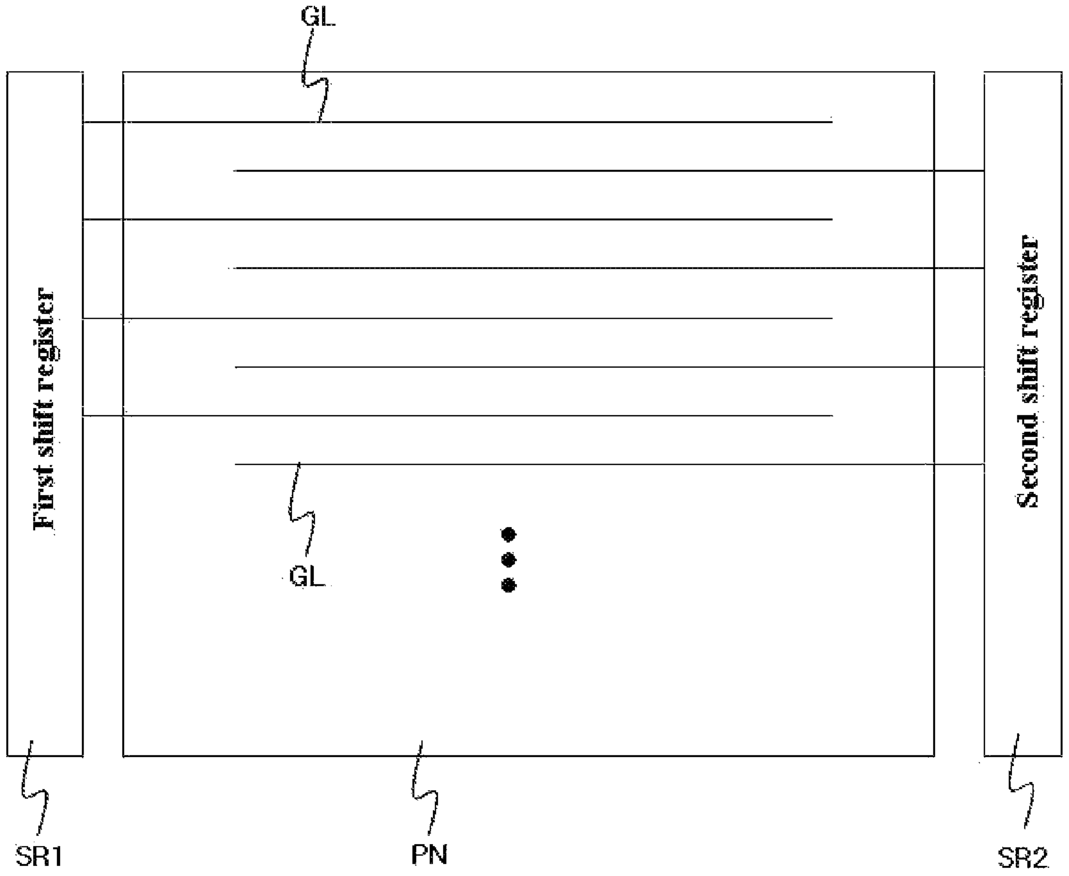
FIG. 17 is a view showing a structure including two shift registers.

FIG. 17 is a view showing a structure including two shift registers.

The shift registers may include first and second shift registers SR1 and SR2. The first shift register SR1 is located at the left side of a display region PN in which gate lines GL are formed, and the second shift register SR2 is located at the right side of the display region PN.

The first shift register SR1 includes odd-numbered ones ST1, ST3, ST5 . . . of the h stages, and the second shift register SR2 includes even-numbered ones ST2, ST4, ST6 . . . of the h stages.

Figure 18:
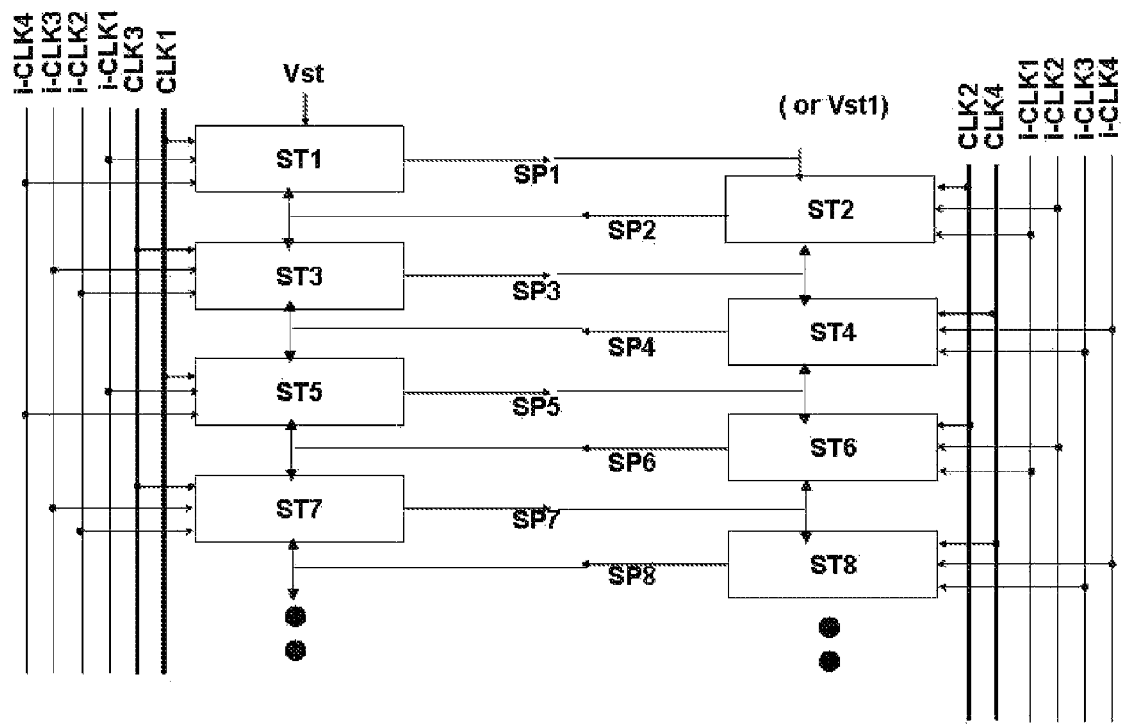
FIG. 18 is a view showing a construction of stages included in the first and second shift registers of FIG. 17.

FIG. 18 is a view showing a construction of the stages included in the first and second shift registers of FIG. 17.

As shown in FIG. 18, the odd-numbered stages are respectively connected to the odd-numbered gate lines via output terminals OT thereof, and the even-numbered stages are respectively connected to the even-numbered gate lines via output terminals OT thereof. Particularly, the odd-numbered stages are supplied with some of the n output clock pulses and with the n output control clock pulses from the first output control clock lines. For example, the odd-numbered stages ST1, ST3, ST5 . . . are supplied with the first and third output clock pulses CLK1 and CLK3, among the first to fourth output clock pulses CLK1 to CLK4, and with the first to fourth output control clock pulses i-CLK1 to i-CLK4 from the first output control clock lines. On the other hand, the even-numbered stages ST2, ST4, ST6 . . . are supplied with the second and fourth output clock pulses CLK2 and CLK4, among the first to fourth output clock pulses CLK1 to CLK4, and with the first to fourth output control clock pulses i-CLK1 to i-CLK4 from the first output control clock lines. The structure of FIG. 18 may include the stages having the circuits of FIG. 11.

Figure 19:
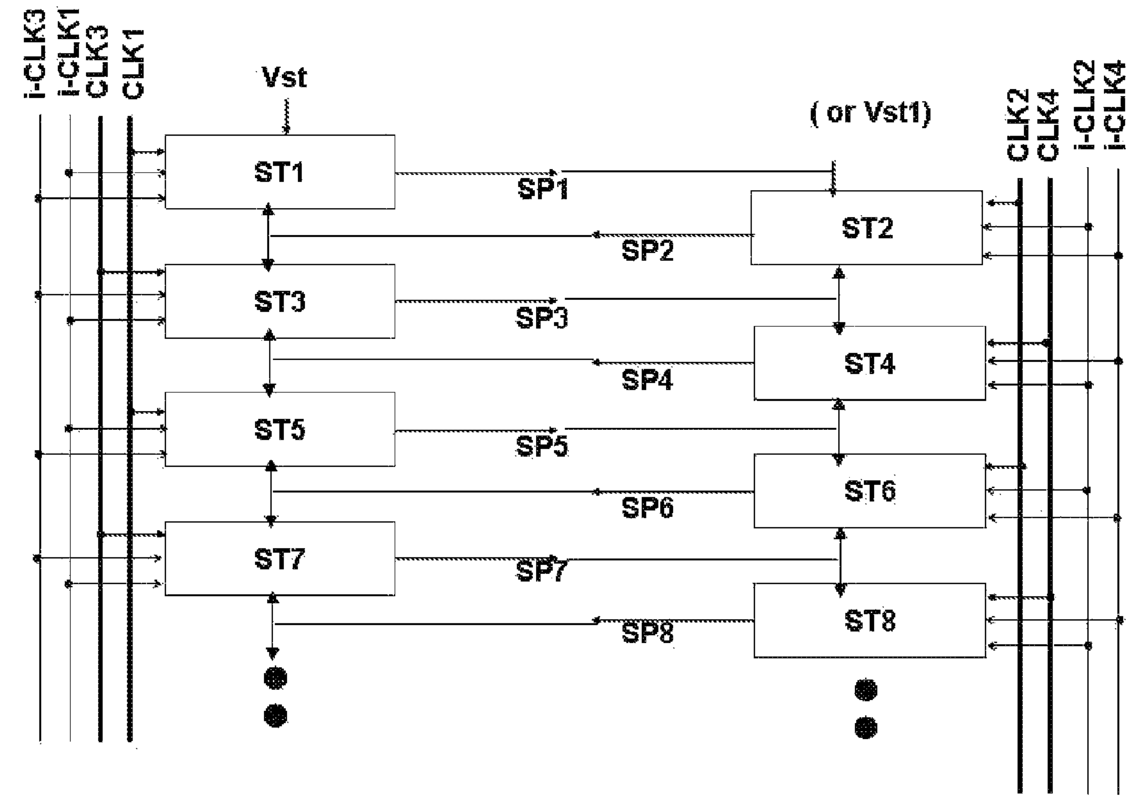
FIG. 19 is a view showing another construction of stages included in the first and second shift registers of FIG. 17.

FIG. 19 is a view showing another construction of the stages included in the first and second shift registers of FIG. 17.

As shown in FIG. 19, the odd-numbered stages are respectively connected to the odd-numbered gate lines via output terminals OT thereof, and the even-numbered stages are respectively connected to the even-numbered gate lines via output terminals OT thereof. Particularly, the odd-numbered stages are supplied with some of the n output clock pulses and with some of the n output control clock pulses, and the even-numbered stages are supplied with the remainder of the n output clock pulses and with the remainder of the n output control clock pulses. For example, the odd-numbered stages ST1, ST3, ST5 . . . are supplied with the first and third output clock pulses CLK1 and CLK3, among the first to fourth output clock pulses CLK1 to CLK4, and with the first and third output control clock pulses i-CLK1 and i-CLK3, among the first to fourth output control clock pulses i-CLK1 to i-CLK4. On the other hand, the even-numbered stages ST2, ST4, ST6 . . . are supplied with the second and fourth output clock pulses CLK2 and CLK4, among the first to fourth output clock pulses CLK1 to CLK4, and with the second and fourth output control clock pulses i-CLK2 and i-CLK4, among the first to fourth output control clock pulses i-CLK1 to i-CLK4.

The structure of FIG. 19 may include the stages having the circuits of FIG. 12.

Meanwhile, in all the embodiments, two identical discharging voltages may be supplied through separate discharging voltage lines or through a single discharging voltage line.

Meanwhile, a gate electrode of the second switching device Tr2 of FIG. 8 may be supplied with a modified full negative iso clock pulse i-CLKc instead of the full negative iso clock pulse i-CLKb.

As is apparent from the above description, a gate driving circuit according to the present invention is configured so that a low voltage of an output control clock pulse is lower than that (corresponding to a low voltage of a scan pulse) of an output clock pulse and is lower than first to third discharging voltages. Consequently, it is possible to minimize current leakage through first and second switching devices for a period in which the output control clock pulse is maintained at the low voltage, thereby stabilizing output from a shift register.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A gate driving circuit comprising:

a first clock generator to sequentially output n (n being a natural number equal to or greater than 2) output clock pulses having different phases in a circulating manner;

a second clock generator to sequentially output n output control clock pulses having different phases in a circulating manner; and a shift register to receive the n output clock pulses from the first clock generator and the n output control clock pulses from the second clock generator and to sequentially output a plurality of scan pulses, wherein high sections of k-th to (k+s)-th (s being a natural number greater than 1) output clock pulses output during adjacent periods overlap with one another for a predetermined time, a k-th output control clock pulse rises before the k-th output clock pulse, the k-th output control clock pulse falls before a (k−a)-th (a being a natural number less than k) output clock pulse, a high section of at least one of the output control clock pulses does not overlap with that of the k-th output clock pulse, and a (k+b)-th (b being a natural number) output clock pulse falls during the high section of the at least one of the output control clock pulses not overlapping with that of the k-th output clock pulse.

2. The gate driving circuit according to claim 1, wherein voltage of each of the output clock pulses in a low section thereof is greater than or equal to that of each of the output control clock pulses in a low section thereof.

3. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the n output clock pulses are transferred through n output clock lines, a p-th (p being a natural number) stage comprises:

a first switching device turned on or off according to one of the n output control clock pulses and interconnecting an output terminal of a (p−q)-th (q being a natural number less than p) stage or a first start transfer line transferring a first start pulse and a set node when turned on;

a second switching device turned on or off according to one of the n output control clock pulses and interconnecting the set node and an output terminal of a (p+r)-th (r being a natural number) stage or a second start transfer line transferring a second start pulse when turned on; and a pull-up switching device turned on or off according to voltage applied to the set node and interconnecting one of the output clock lines and an output terminal of the p-th stage when turned on, a k-th output clock pulse is supplied to the pull-up switching device, a k-th output control clock pulse is supplied to the first switching device, a high section of an output control clock pulse supplied to the second switching device does not overlap with that of the k-th output clock pulse, and a (k+b)-th output clock pulse falls during the high section of the output control clock pulse supplied to the second switching device.

4. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the n output clock pulses are transferred through n output clock lines, a p-th (p being a natural number) stage comprises:

a first switching device turned on or off according to one of the n output control clock pulses and interconnecting an output terminal of a (p−q)-th (q being a natural number less than p) stage or a first start transfer line transferring a first start pulse and a set node when turned on;

a second switching device turned on or off according to one of the n output control clock pulses and interconnecting the set node and an output terminal of a (p+r)-th (r being a natural number) stage when turned on;

a third switching device turned on or off according to an output clock pulse from one of the output clock lines and interconnecting a charging voltage line transferring a charging voltage and a reset node when turned on;

a fourth switching device turned on or off according to voltage applied to the set node and interconnecting the reset node and a second discharging voltage line transferring a second discharging voltage when turned on;

a pull-up switching device turned on or off according to voltage applied to the set node and interconnecting one of the output clock lines and an output terminal of the p-th stage when turned on; and a pull-down switching device turned on or off according to voltage applied to the reset node and interconnecting the output terminal of the p-th stage and a first discharging voltage line transferring a first discharging voltage when turned on, a k-th output clock pulse is supplied to the pull-up switching device, a k-th output control clock pulse is supplied to the first switching device, a high section of an output control clock pulse supplied to the second switching device does not overlap with that of the k-th output clock pulse, and a (k+b)-th output clock pulse falls during the high section of the output control clock pulse supplied to the second switching device.

5. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the n output clock pulses are transferred through n output clock lines, a p-th (p being a natural number) stage comprises:

a first switching device turned on or off according to one of the n output control clock pulses and interconnecting an output terminal of a (p−q)-th (q being a natural number less than p) stage or a first start transfer line transferring a first start pulse and a set node when turned on;

a second switching device turned on or off according to one of the n output control clock pulses and interconnecting the set node and an output terminal of a (p+r)-th (r being a natural number) stage when turned on;

a third switching device turned on or off according to an output clock pulse from one of the output clock lines and interconnecting a charging voltage line transferring a charging voltage and a common node when turned on;

a fourth switching device turned on or off according to voltage applied to the set node and interconnecting the common node and a second discharging voltage line transferring a second discharging voltage when turned on;

a fifth switching device turned on or off according to voltage applied to the common node and interconnecting the charging voltage line and a reset node when turned on;

a sixth switching device turned on or off according to voltage applied to the set node and interconnecting the reset node and the second discharging voltage line when turned on;

a pull-up switching device turned on or off according to voltage applied to the set node and interconnecting one of the output clock lines and an output terminal of the p-th stage when turned on; and a pull-down switching device turned on or off according to voltage applied to the reset node and interconnecting the output terminal of the p-th stage and a first discharging voltage line transferring a first discharging voltage when turned on, a k-th output clock pulse is supplied to the pull-up switching device, a k-th output control clock pulse is supplied to the first switching device, a high section of an output control clock pulse supplied to the second switching device does not overlap with that of the k-th output clock pulse, and a (k+b)-th output clock pulse falls during the high section of the output control clock pulse supplied to the second switching device.

6. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the n output clock pulses are transferred through n output clock lines, a p-th (p being a natural number) stage comprises:

a first switching device turned on or off according to one of the n output control clock pulses and interconnecting an output terminal of a (p−q)-th (q being a natural number less than p) stage or a first start transfer line transferring a first start pulse and a set node when turned on;

a second switching device turned on or off according to one of the n output control clock pulses and interconnecting the set node and an output terminal of a (p+r)-th (r being a natural number) stage when turned on;

a third switching device turned on or off according to an output control clock pulse from one of the output control clock lines or an output clock pulse from one of the output clock lines and interconnecting an output terminal of the p-th stage and a charging voltage line transferring a charging voltage when turned on; and a pull-up switching device turned on or off according to voltage applied to the set node and interconnecting one of the output clock lines and the output terminal of the p-th stage when turned on, a k-th output clock pulse is supplied to the pull-up switching device, a k-th output control clock pulse is supplied to the first switching device, a high section of an output control clock pulse supplied to the second switching device does not overlap with that of the k-th output clock pulse, a (k+b)-th output clock pulse falls during the high section of the output control clock pulse supplied to the second switching device, and a high section of an output control clock pulse supplied to the third switching device does not overlap with that of the k-th output clock pulse.

7. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the n output clock pulses are transferred through n output clock lines, a p-th (p being a natural number) stage comprises:

a first switching device turned on or off according to one of the n output control clock pulses and interconnecting an output terminal of a (p−q)-th (q being a natural number less than p) stage or a first start transfer line transferring a first start pulse and a set node when turned on;

a second switching device turned on or off according to one of the n output control clock pulses and interconnecting the set node and an output terminal of a (p+r)-th (r being a natural number) stage when turned on;

a third switching device turned on or off according to an output control clock pulse from one of the output control clock lines or an output clock pulse from one of the output clock lines and interconnecting an output terminal of the p-th stage and one of the output clock lines when turned on; and a pull-up switching device turned on or off according to voltage applied to the set node and interconnecting one of the output clock lines and the output terminal of the p-th stage when turned on, a k-th output clock pulse is supplied to the pull-up switching device, a k-th output control clock pulse is supplied to the first switching device, a high section of an output control clock pulse supplied to the second switching device does not overlap with that of the k-th output clock pulse, a (k+b)-th output clock pulse falls during the high section of the output control clock pulse supplied to the second switching device, a high section of an output control clock pulse supplied to the third switching device does not overlap with that of the k-th output clock pulse, and the output clock pulse supplied to the pull-up switching device and the output clock pulse supplied to the third switching device are the same.

8. The gate driving circuit according to claim 6 or 7, wherein the p-th stage further comprises a fourth switching device turned on or off according to voltage from the output terminal of the p-th stage and interconnecting the output terminal of the p-th stage and one of the output clock lines when turned on, and the output clock pulse supplied to the pull-up switching device and the output clock pulse supplied to the fourth switching device are the same.

9. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the n output clock pulses are transferred through n output clock lines, a p-th (p being a natural number) stage comprises:

a first switching device turned on or off according to one of the n output control clock pulses and interconnecting an output terminal of a (p−q)-th (q being a natural number less than p) stage or a first start transfer line transferring a first start pulse and a set node when turned on;

a second switching device turned on or off according to one of the n output control clock pulses and interconnecting the set node and an output terminal of a (p+r)-th (r being a natural number) stage when turned on;

a third switching device turned on or off according to an output clock pulse from one of the output clock lines and interconnecting a charging voltage line transferring a charging voltage and a common node when turned on;

a fourth switching device turned on or off according to voltage applied to the set node and interconnecting the common node and a second discharging voltage line transferring a second discharging voltage when turned on;

a fifth switching device turned on or off according to voltage applied to the common node and interconnecting the charging voltage line and a reset node when turned on;

a sixth switching device turned on or off according to voltage applied to the set node and interconnecting the reset node and the second discharging voltage line when turned on;

a pull-up switching device turned on or off according to voltage applied to the set node and interconnecting one of the output clock lines and an output terminal of the p-th stage when turned on; and a pull-down switching device turned on or off according to voltage applied to the reset node and interconnecting the output terminal of the p-th stage and a first discharging voltage line transferring a first discharging voltage when turned on, a k-th output clock pulse is supplied to the pull-up switching device, a k-th output control clock pulse is supplied to the first switching device, a high section of an output control clock pulse supplied to the second switching device does not overlap with that of the k-th output clock pulse, a (k+b)-th output clock pulse falls during the high section of the output control clock pulse supplied to the second switching device, and the high section of the output control clock pulse supplied to the second switching device belongs to that of an output clock pulse used as an output of a (p+r)-th stage.

10. The gate driving circuit according to claim 9, wherein the p-th stage further comprises a seventh switching device turned on or off according to one of the n output control clock pulses and interconnecting the set node and a third discharging voltage line transferring a third discharging voltage when turned on, and a high section of an output control clock pulse supplied to the seventh switching device does not overlap with that of the k-th output clock pulse.

11. The gate driving circuit according to claim 1, wherein the n output clock pulses comprise first to fourth output clock pulses having different phases or first to eighth output clock pulses having different phases, and the n output control clock pulses comprise first to fourth output control clock pulses having different phases or first to eighth output control clock pulses having different phases.

12. The gate driving circuit according to claim 11, wherein:

the first clock generator sequentially outputs the first to fourth output clock pulses in a circulating manner;

the second clock generator sequentially outputs the first to fourth output control clock pulses in a circulating manner;

the first output control clock pulse rises before the first output clock pulse, the first output control clock pulse falls before the fourth output clock pulse, a high section of the fourth output control clock pulse does not overlap with that of the first output clock pulse, and the second output clock pulse falls during the high section of the fourth output control clock pulse;

the second output control clock pulse rises before the second output clock pulse, the second output control clock pulse falls before the first output clock pulse, a high section of the first output control clock pulse does not overlap with that of the second output clock pulse, and the third output clock pulse falls during the high section of the first output control clock pulse;

the third output control clock pulse rises before the third output clock pulse, the third output control clock pulse falls before the second output clock pulse, a high section of the second output control clock pulse does not overlap with that of the third output clock pulse, and the fourth output clock pulse falls during the high section of the second output control clock pulse; and the fourth output control clock pulse rises before the fourth output clock pulse, the fourth output control clock pulse falls before the third output clock pulse, a high section of the third output control clock pulse does not overlap with that of the fourth output clock pulse, and the first output clock pulse falls during the high section of the third output control clock pulse.

13. The gate driving circuit according to claim 11, wherein the first clock generator sequentially outputs the first to eighth output clock pulses in a circulating manner;

high sections of three adjacent ones of the output clock pulses overlap with one another for a predetermined time;

the second clock generator sequentially outputs the first to eighth output control clock pulses in a circulating manner;

high sections of two adjacent ones of the output control clock pulses overlap with each other for a predetermined time;

the first output control clock pulse rises before the first output clock pulse, the first output control clock pulse falls before the seventh output clock pulse, high sections of the sixth, seventh and eighth output control clock pulses do not overlap with that of the first output clock pulse, and the third output clock pulse falls during the high section of the sixth output control clock pulse;

the second output control clock pulse rises before the second output clock pulse, the second output control clock pulse falls before the eighth output clock pulse, high sections of the seventh, eighth and first output control clock pulses do not overlap with that of the second output clock pulse, and the fourth output clock pulse falls during the high section of the seventh output control clock pulse;

the third output control clock pulse rises before the third output clock pulse, the third output control clock pulse falls before the first output clock pulse, high sections of the eighth, first and second output control clock pulses do not overlap with that of the third output clock pulse, and the fifth output clock pulse falls during the high section of the eighth output control clock pulse;

the fourth output control clock pulse rises before the fourth output clock pulse, the fourth output control clock pulse falls before the second output clock pulse, high sections of the first, second and third output control clock pulses do not overlap with that of the fourth output clock pulse, and the sixth output clock pulse falls during the high section of the first output control clock pulse;

the fifth output control clock pulse rises before the fifth output clock pulse, the fifth output control clock pulse falls before the third output clock pulse, high sections of the second, third and fourth output control clock pulses do not overlap with that of the fifth output clock pulse, and the seventh output clock pulse falls during the high section of the second output control clock pulse;

the sixth output control clock pulse rises before the sixth output clock pulse, the sixth output control clock pulse falls before the fourth output clock pulse, high sections of the third, fourth and fifth output control clock pulses do not overlap with that of the sixth output clock pulse, and the eighth output clock pulse falls during the high section of the third output control clock pulse;

the seventh output control clock pulse rises before the seventh output clock pulse, the seventh output control clock pulse falls before the fifth output clock pulse, high sections of the fourth, fifth and sixth output control clock pulses do not overlap with that of the seventh output clock pulse, and the first output clock pulse falls during the high section of the fourth output control clock pulse; and the eighth output control clock pulse rises before the eighth output clock pulse, the eighth output control clock pulse falls before the sixth output clock pulse, high sections of the fifth, sixth and seventh output control clock pulses do not overlap with that of the eighth output clock pulse, and the second output clock pulse falls during the high section of the fifth output control clock pulse.

14. The gate driving circuit according to claim 1, wherein the n output clock pulses comprise n forward output clock pulses, which are forwardly output, and n reverse output clock pulses, which are reversely output, and the n output control clock pulses comprise n forward output control clock pulses, which are forwardly output, and n reverse output control clock pulses, which are reversely output.

15. The gate driving circuit according to claim 1, wherein the shift register comprises a plurality of stages to sequentially output scan pulses, each of the stages outputs a scan pulse through an output terminal thereof, the n output control clock pulses are transferred through n first output control clock lines and n second output control clock lines, the n output clock pulses are transferred through n output clock lines, odd ones of the stages are respectively connected to odd-numbered gate lines via output terminals thereof, even ones of the stages are respectively connected to even-numbered gate lines via output terminals thereof, the odd-numbered stages are supplied with some of the n output clock pulses and with n output control clock pulses from the first output control clock lines, and the even-numbered stages are supplied with the remainder of the n output clock pulses and with n output control clock pulses from the second output control clock lines.

16. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the n output clock pulses are transferred through n output clock lines, odd ones of the stages are respectively connected to odd-numbered gate lines via output terminals thereof, even ones of the stages are respectively connected to even-numbered gate lines via output terminals thereof, the odd-numbered stages are supplied with some of the n output clock pulses and with some of the n output control clock pulses, and the even-numbered stages are supplied with the remainder of the n output clock pulses and with the remainder of the n output control clock pulses.

17. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the n output clock pulses are transferred through n output clock lines, a p-th (p being a natural number) stage comprises:

a first switching device turned on or off according to one of the n output control clock pulses and interconnecting an output terminal of a (p−q)-th (q being a natural number less than p) stage or a first start transfer line transferring a first start pulse and a set node when turned on;

a second switching device turned on or off according to one of the n output control clock pulses and interconnecting the set node and an output terminal of a (p+r)-th (r being a natural number) stage when turned on;

a third switching device turned on or off according to voltage applied to the set node and interconnecting a reset node and a second discharging voltage line transferring a second discharging voltage when turned on;

a pull-up switching device turned on or off according to voltage applied to the set node and interconnecting one of the output clock lines and an output terminal of the p-th stage when turned on;

a pull-down switching device turned on or off according to voltage applied to the reset node and interconnecting the output terminal of the p-th stage and a first discharging voltage line transferring a first discharging voltage when turned on; and a capacitor connected between one of the output clock lines and the reset node, a k-th output clock pulse is supplied to the pull-up switching device, a k-th output control clock pulse is supplied to the first switching device, a high section of an output control clock pulse supplied to the second switching device does not overlap with that of the k-th output clock pulse, a (k+b)-th output clock pulse falls during the high section of the output control clock pulse supplied to the second switching device, and the output clock pulse supplied to the capacitor and the output clock pulse supplied to the pull-up switching device are the same.

18. The gate driving circuit according to claim 3, wherein a and q are the same, and b and r are the same.

19. The gate driving circuit according to claim 3, wherein a, q, b and r are the same.

20. The gate driving circuit according to claim 3, wherein s, a, b, q and r are the same.

* * * * *